United States Patent [19]
Ohtsuka et al.

[11] Patent Number: 6,069,350
[45] Date of Patent: May 30, 2000

[54] SOLID STATE IMAGING DEVICE AND METHOD OF MANUFACTURING THE SAME

[75] Inventors: Yoichi Ohtsuka; Atsushi Asai, both of Kanagawa, Japan

[73] Assignee: Sony Corporation, Tokyo, Japan

[21] Appl. No.: 09/010,536

[22] Filed: Jan. 22, 1998

[30] Foreign Application Priority Data

Jan. 23, 1997 [JP] Japan ..................... 9-010432

[51] Int. Cl.[7] .............................. H01L 31/0232
[52] U.S. Cl. ................ 250/208.1; 257/233; 257/294; 257/432
[58] Field of Search ................. 250/208.1, 216; 257/222, 225, 231, 232, 233, 294, 432, 435, 436; 348/294, 298, 311

[56] References Cited

U.S. PATENT DOCUMENTS 5,306,926  4/1994  Yonemoto ..................... 250/208.1
5,324,930  6/1994  Jech, Jr. ..................... 250/208.1

*Primary Examiner*—Edward P. Westin
*Assistant Examiner*—Kevin Pyo
*Attorney, Agent, or Firm*—Hill & Simpson

[57] ABSTRACT

In a solid state imaging device having light receiving sections arranged in horizontal and vertical directions with different pitches, an on-chip micro-lens having a focusing efficiency optimized in both horizontal and vertical directions is formed. The solid state imaging device comprises a plurality of light receiving sections (42) arranged in horizontal and vertical directions with different pitches, a foundation layer (47) formed over the light receiving sections (42) and having convex portions on portions between the light receiving sections (42) in a fine pitch direction and having concave portions at least along a straight line connecting centers of the light receiving sections in a coarse pitch direction, and a plurality of lenses (48) formed on the concave portions so as to at least partially overlap on the convex portions in correspondence with the light receiving sections (42).

7 Claims, 32 Drawing Sheets

FIG. 3A
(PRIOR ART)
FIG. 3B
(PRIOR ART)
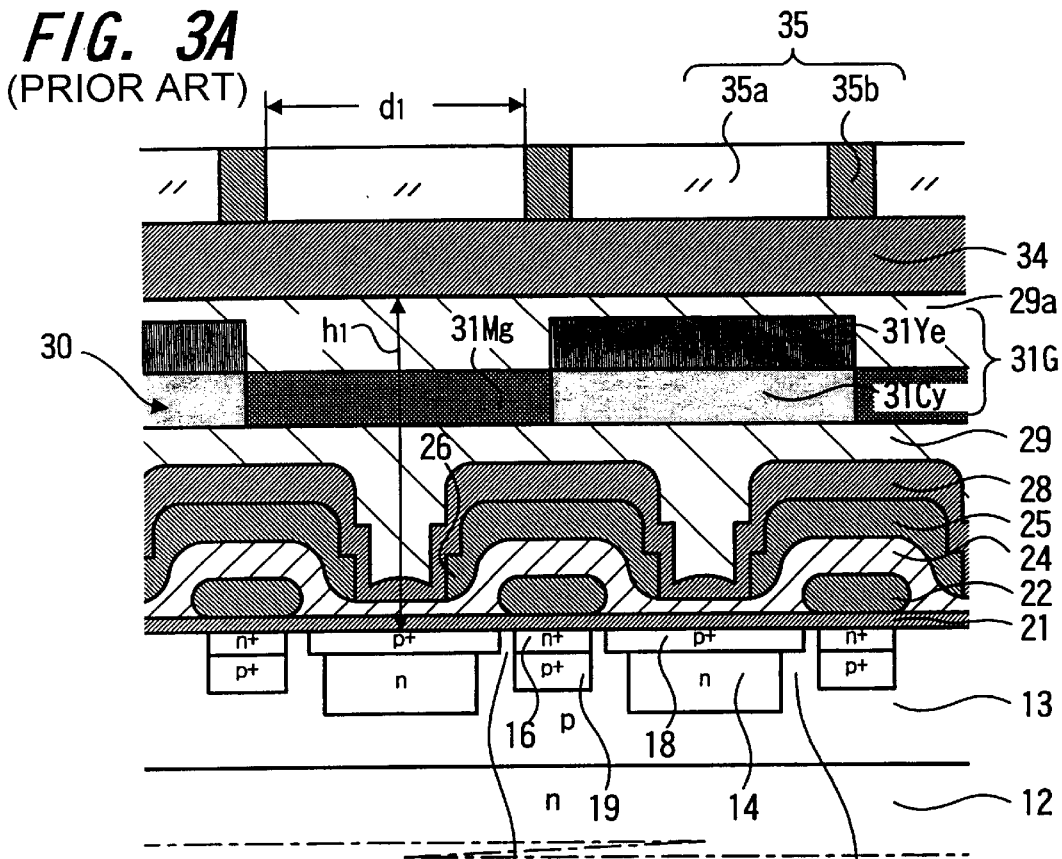
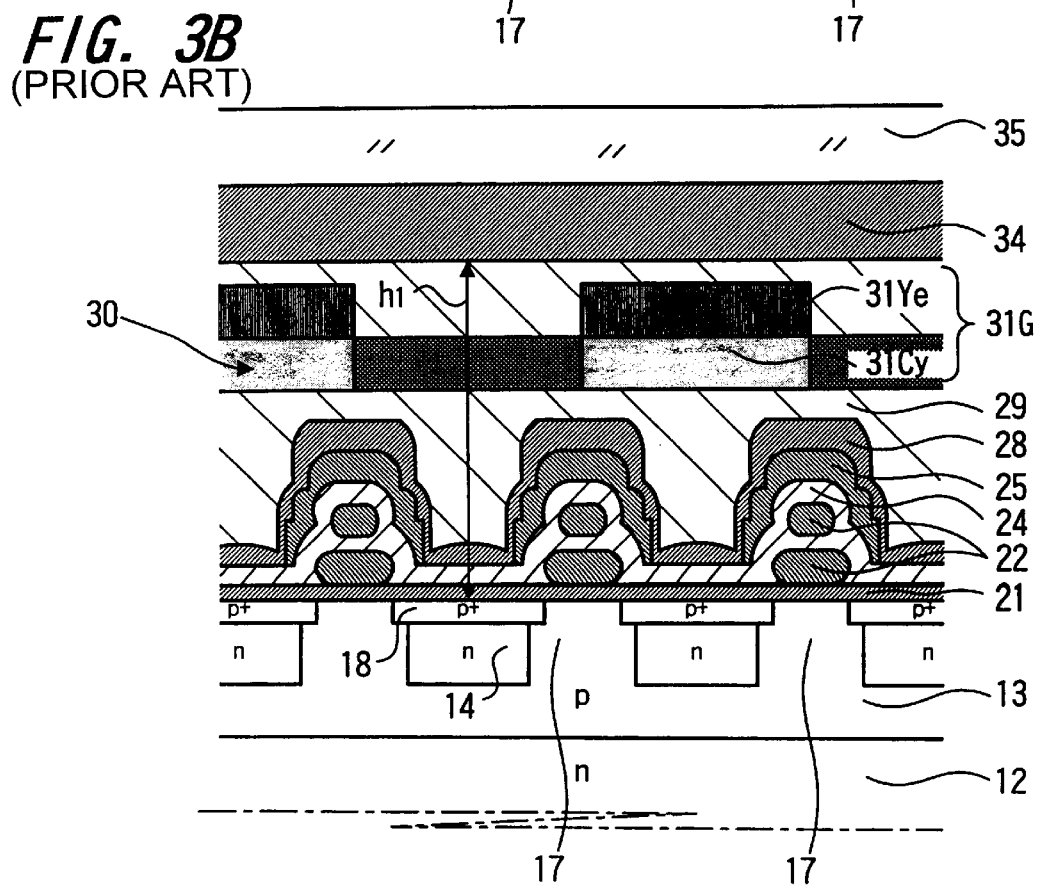

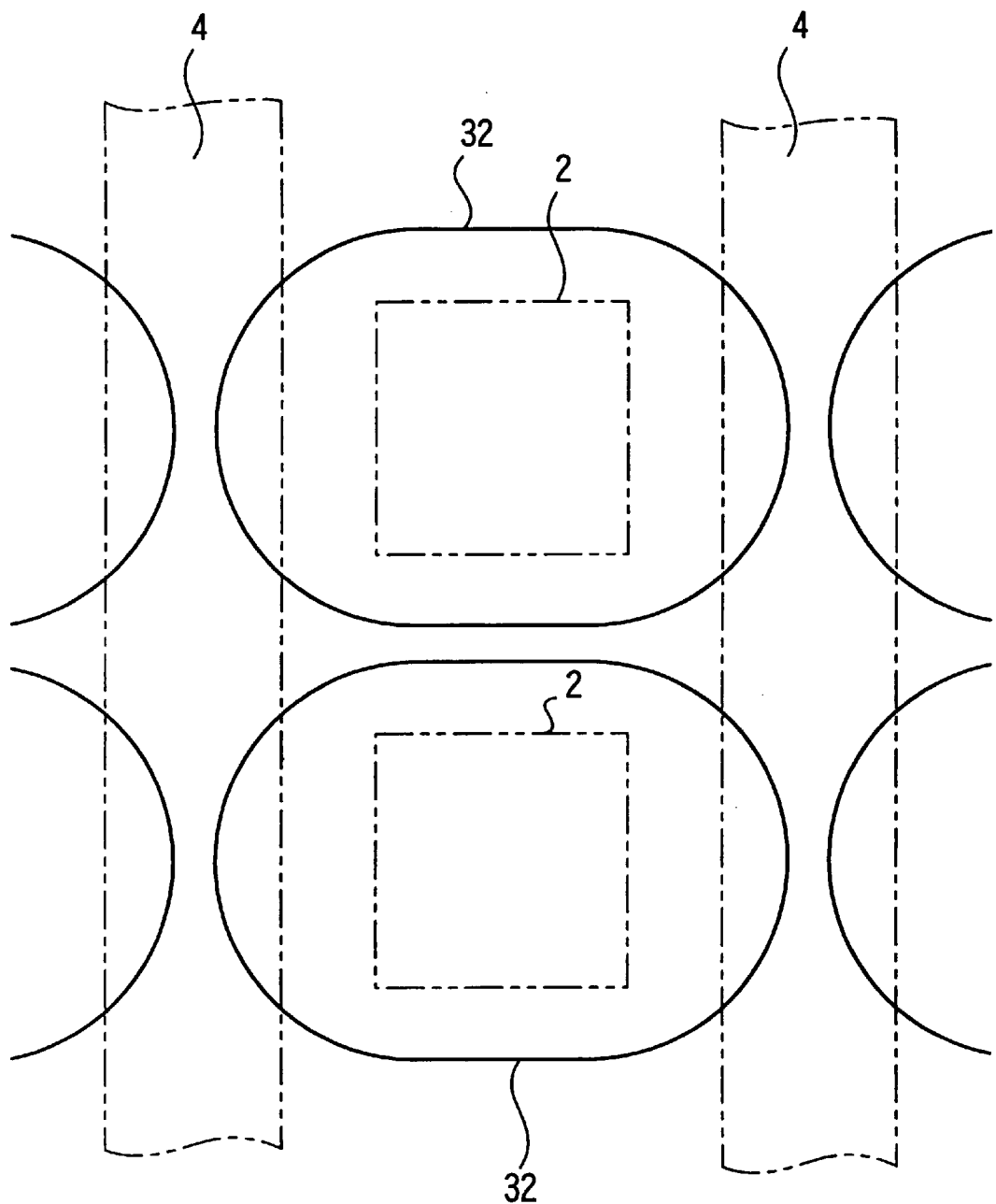

SOLID STATE IMAGING DEVICE AND METHOD OF MANUFACTURING THE SAME

BACKGROUND OF THE INVENTION

The present invention relates to a solid state imaging device having an on-chip micro-lens and its manufacturing method.

FIGS. 1, 2A and 2B show an example of a CCD solid state imaging device 1 having an on-chip microlens. This CCD solid state imaging device 1 has a configuration shown in FIG. 1. That is, in its imaging area, a plurality of light receiving sections 2 are arranged in a matrix form. On one side of each column of the light receiving sections 2, a vertical transfer register 4 having a CCD structure is formed via a readout gate section 3. In correspondence with each unit pixel 5, an on-chip micro-lens 6 is formed on its light receiving section 2.

In this example, the unit pixels 5, i.e., their light receiving sections 2 have a pitch in the horizontal direction different from that in the vertical direction. For example, the pitch is coarse in the horizontal direction, and fine in the vertical direction. Assuming now that each unit pixel 5 has a length $L_H$ in the horizontal direction and a length $L_V$ in the vertical direction, the relation $L_H > L_V$ holds true and each unit pixel 5 takes a shape which is long in the horizontal direction.

FIGS. 2A and 2B show sections of FIG. 1 respectively in the horizontal and vertical directions.

On a silicon substrate 12 of a first conduction type, such as, for example, n-type, of the CCD solid state imaging device 1, a first well region 13 of a second conduction type, i.e., p-type is formed. In the first p-type well region 13, an n-type impurity diffusion region 14 and an n-type transfer channel region 16 constituting the vertical transfer register 4 are formed. Although not illustrated, a p-type channel stop region is formed in a pixel separation section 17 as occasion demands. On the n-type impurity diffusion region 14, a p-type positive charge storage area 18 is formed. Just under the transfer channel region 16, a second p-type well region 19 is formed.

By the p-type well region 13, the n-type impurity diffusion region 14, and the p-type positive charge storage region 18, a so-called HAD (hole accumulated diode) sensor is formed. By this HAD sensor, the light receiving section 2 is formed.

Over the transfer channel region 16 constituting the vertical transfer register 4, the readout gate section 3, and the pixel separation section 17, a transfer electrode 22 including a first layer of polycrystal silicon and a second layer of polycrystal silicon is formed via a gate insulation film 21. By the transfer channel region 16, the gate insulation film 21, and the transfer electrode 22, the vertical transfer register 4 of the CCD structure is formed.

On the entire surface including the transfer electrodes 22, an inter-layer insulating film 24 is formed. Furthermore, a light shield film 25 made of, for example, Al is selectively formed so as to cover a portion of the inter-layer insulating film 24 corresponding to the transfer electrode 22.

In order to obstruct light (light inputted obliquely) inputted from the light receiving section 2 directly to the vertical transfer register 4, a projection 25a partially extending to the side of the light receiving section 2 is formed in the light shield film 25. In other words, an opening section 26 facing the light receiving section 2 is formed in the light shield film 25.

On the entire surface including the light shield film 25, a passivation film 28 is formed. Furthermore, a planarization film 29 is formed. On the planarization film 29, a color filter layer 30 is formed. At a position on the color filter layer 30 corresponding to the light receiving section 2, an on-chip micro-lens 32 is formed.

The color filter layer 30 is formed by a repetition of a pattern having a magenta color 31MG, a cyan color 31Cy, a yellow color 31Ye, and a green color 31G arranged in a rectangle form bisected in both the vertical and horizontal directions. The green color 31G is formed by two layers of the cyan color 31Cy and the yellow color 31Ye.

FIGS. 1 through 4 show a method for manufacturing the conventional CCD solid state imaging device, especially its on-chip micro-lens.

FIGS. 3A, 3B, and FIGS. 5A, 5B are sectional views along lines A—A and B—B, respectively, in corresponding plan views of FIGS. 4 and 6.

First of all, the light receiving section 2, the vertical transfer register 4, the light shield film 25, and the color filter layer 30 are formed as shown in FIGS. 3A, 3B and 4. Thereafter, on the color filter layer 30, a photoresist layer 34 of, for example, a negative type serving as an on-chip lens material is coated and formed via a planarization film 29a. On this photoresist layer 34, a mask 35 is formed. The mask 35 includes a light transmitting section 35a separated so as to correspond to each of pixels, and a light shield sections 35b located between adjacent light transmitting sections 35a. Each light transmitting section 35a takes the shape of a rectangle, or takes a shape which is long in the lateral direction and has circular arcs at both ends in the illustrated horizontal direction. Light is applied via the mask 35, and the photoresist layer 34 is exposed to light.

Subsequently, as shown in FIGS. 5A, 5B and 6, development is conducted so as to remove areas of the photoresist layer which have not yet been exposed to light. Thereafter, heat treatment is conducted at approximately 130 to 200° C. for 30 to 6000 seconds, for example. By using the viscosity of the photoresist, reflow is effected thereon to form a dome-shaped on-chip microlens 32 having a spherical surface. In this way, there is obtained the CCD solid state imaging device 1 having the on-chip micro-lens 32 in correspondence with the light receiving section 2 of each pixel thereon.

In this example, the height between the silicon substrate 12 and the on-chip micro-lens 32 is $h_1$ in both horizontal and vertical directions. In this example, in order to match focusing in the horizontal direction, the height $h_1$ between the silicon substrate 12 and the on-chip micro-lens 32 and the thickness of the on-chip micro-lens 32 are determined. In the vertical direction, therefore, focusing is not attained.

In the above described conventional CCD solid state imaging device 1, the unit pixel 5 has a size in the horizontal direction (scanning direction on the television screen) different from that in the vertical direction. In other words, the pixel pitch in the horizontal direction is different from that in the vertical direction. In this case, the single on-chip micro-lens 32 takes the shape of a portion of a spherical surface. Since the curvature in the section of the horizontal direction is different from that of the vertical direction, however, there occurs an extreme difference in focusing efficiency between the horizontal direction and the vertical direction. In other words, if an incident light L is focused in the horizontal direction as shown in FIG. 2A, focusing is not attained in the vertical direction as shown in FIG. 2B, resulting in a lowered focusing efficiency. Therefore, it was difficult to obtain such a focusing state compatible with both the horizontal direction and the vertical direction.

Thus, in order to improve the focusing, it was attempted to narrow the gap between the on-chip micro-lenses 32 at every unit pixel, to form a material having a high refractive index over the opening of the light shield film and under the on-chip color filter so as to be convex downward to be combined with the above-mentioned on-chip micro-lens.

Even in such a case, it was impossible to conduct focusing and propagation of light beyond the focusing efficiency of the on-chip micro-lens. Eventually, the focusing efficiency of the on-chip micro-lens disposed at the uppermost position dominated characteristics such as the sensitivity or the like of the imaging device.

Even in the numerous attempts as described above, a further improvement of the sensitivity becomes a great problem as the pixels of the CCD solid state imaging device become smaller.

SUMMARY OF THE INVENTION

In view of such aspects, it is an object of the present invention to provide a solid state imaging device and a method for manufacturing the same capable of especially having a raised focusing efficiency in both the horizontal and vertical directions by means of a nonspherical shape of a composite on-chip micro-lens, and consequently having improved imaging characteristics such as improved sensitivity and smear or the like, and improved output uniformity irrespective of the sensitivity and the light quantity.

A solid state imaging device according to the present invention includes light receiving sections arranged in horizontal and vertical directions at different pitches, a foundation layer formed over the light receiving sections, having convex portions between the light receiving sections in a fine pitch direction, and having concave portions at least along a straight line connecting centers of the light receiving sections in a coarse pitch direction, and lenses formed on the concave portions so as to at least partially overlap the convex portions via the foundation layer.

Owing to this configuration, an on-chip micro-lens shape having optimum focusing in both the coarse pitch direction and the fine pitch direction is obtained.

A solid state imaging device according to the present invention is of such an arrangement that above light receiving sections arranged in horizontal and vertical directions with different pitches, on-chip micro-lenses are formed, each of the lenses having a face to which transcribed is a face of an upper layer as a lens face, the upper layer being formed in correspondence with the light receiving section so as to extend over a foundation layer having convex portion on portions between light receiving sections in a fine pitch direction and concave portions at least along a straight line connecting centers of the light receiving sections in a coarse pitch direction.

Owing to this configuration, an on-chip micro-lens shape having optimum focusing in both the coarse pitch direction and the fine pitch direction is obtained.

A method for manufacturing a solid state imaging device according to the present invention includes forming a foundation layer over light receiving sections, the foundation layer having convex portions between the light receiving sections in a fine pitch direction and concave portions at least along a straight line connecting centers of the light receiving sections in a coarse pitch direction, and forming lenses on the concave portions of the foundation layer so as to at least partially overlap the convex portions and so as to be respectively corresponded with the light receiving sections.

In this manufacturing method, the foundation layer having convex portions between the light receiving sections in a fine pitch direction and having concave portions at least along a straight line connecting centers of the light receiving sections in a coarse pitch direction is formed, and lenses are formed on the foundation layer so as to fill up the concave portions and so as to be corresponded with the concave portions. As a result, an on-chip micro-lens shape having optimum focusing efficiency in both the coarse pitch direction and the fine pitch direction can be manufactured.

According to a method for manufacturing a solid state imaging device of the present invention includes forming a foundation layer is formed over a lens material layer, the foundation layer having convex portions between the light receiving sections in a fine pitch direction and concave portions at least along a straight line connecting centers of the light receiving sections in a coarse pitch direction, an upper layer is formed on the concave portions of the foundation at least partially overlap the convex portions in correspondence with the light receiving sections, and a lens face of each of the upper layers is transcribed to the lens material layer by means of etch back and thereby forming lenses in correspondence with the light receiving sections.

In this manufacturing method, upper layers having lens faces are formed so as to fill up the concave portions of the foundation layer, and a lens face of each of the upper layers is transcribed to the lens material layer by means of etch back, whereby an on-chip micro-lens shape having optimum focusing efficiency in both the coarse pitch direction and the fine pitch direction can be manufactured.

BRIEF DESCRIPTION OF THE DRAWING

FIGS. 3A and 3B are manufacturing process diagrams of the solid state imaging device of FIG. 1 (showing sectional views of FIG. 4 in the horizontal direction and vertical direction, respectively);

FIG. 6 is a plan view of FIGS. 5A and 5B;

DETAILED DESCRIPTION OF THE PREFERRED EMBODIMENTS

Figure 1:
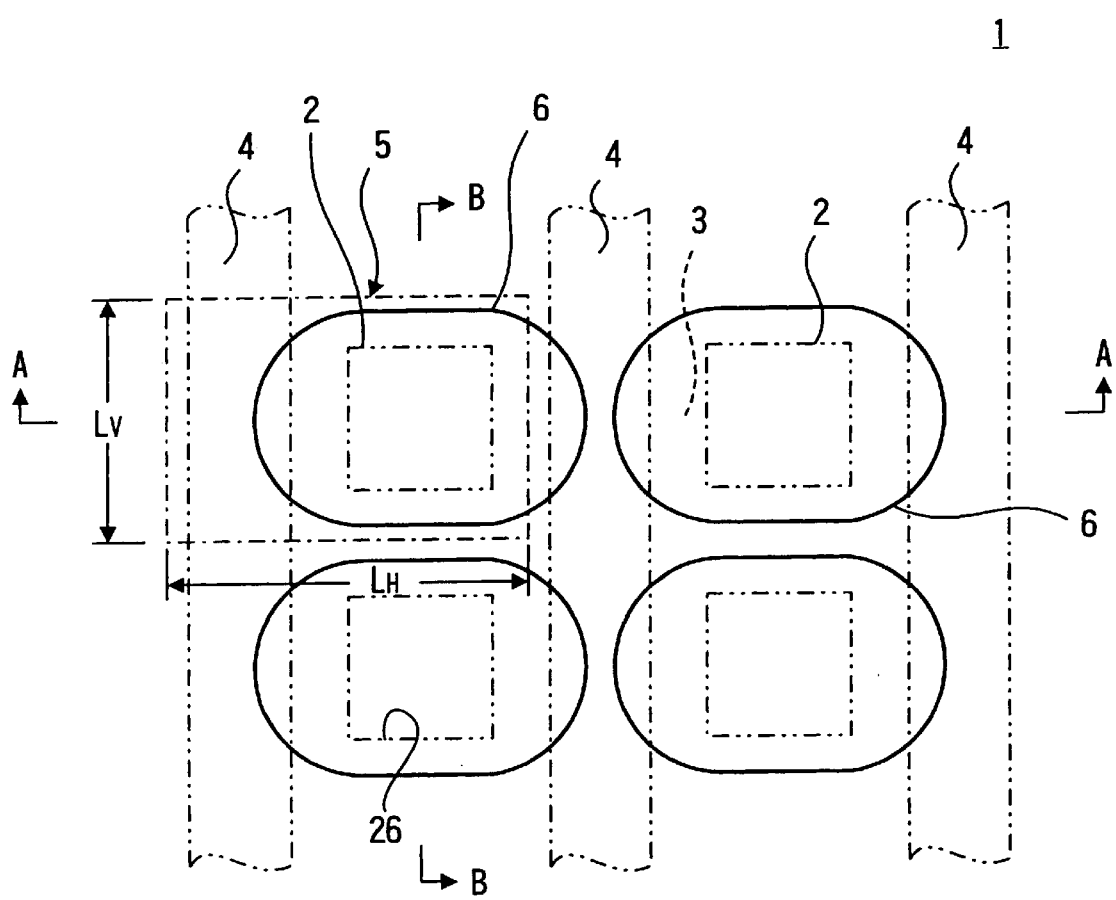
FIG. 1 is a plan view of a solid state imaging device.
Figure 2A:
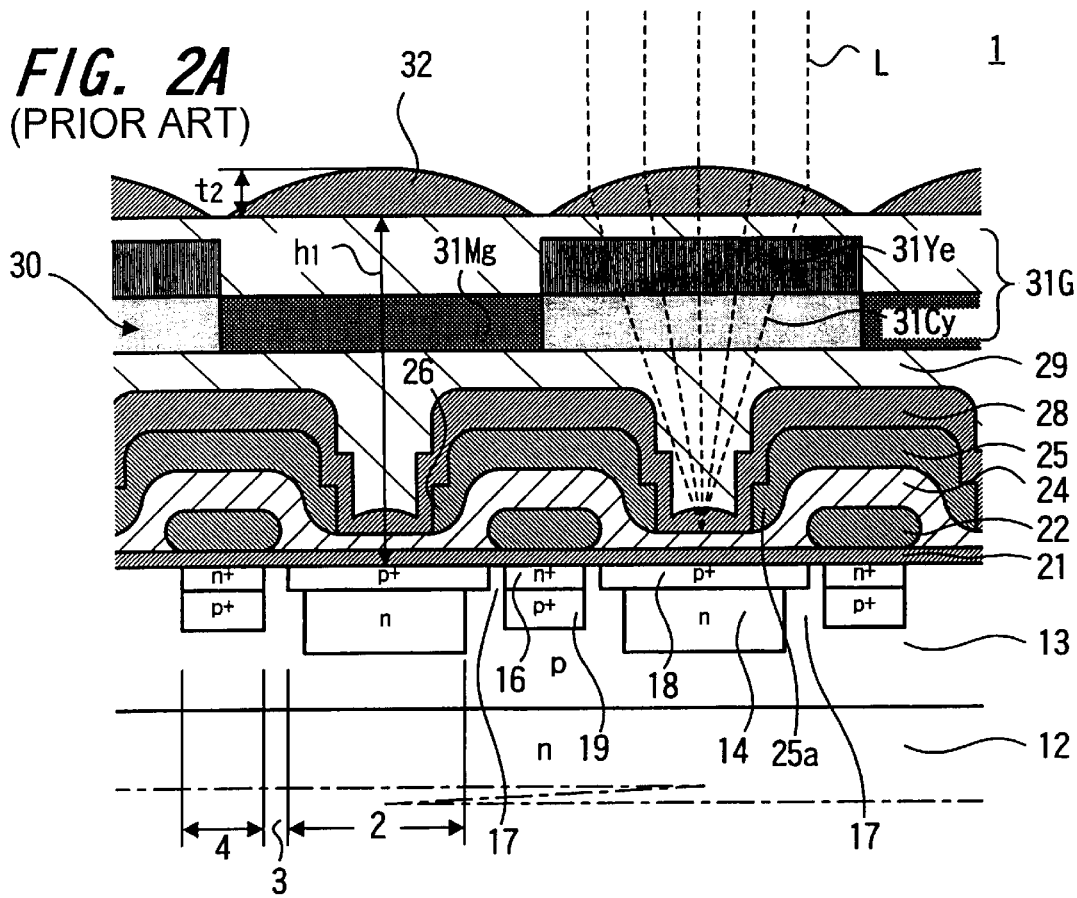
FIGS. 2A and 2B are sectional views along a line A—A and a line B—B of FIG. 1, respectively.
Figure 2B:
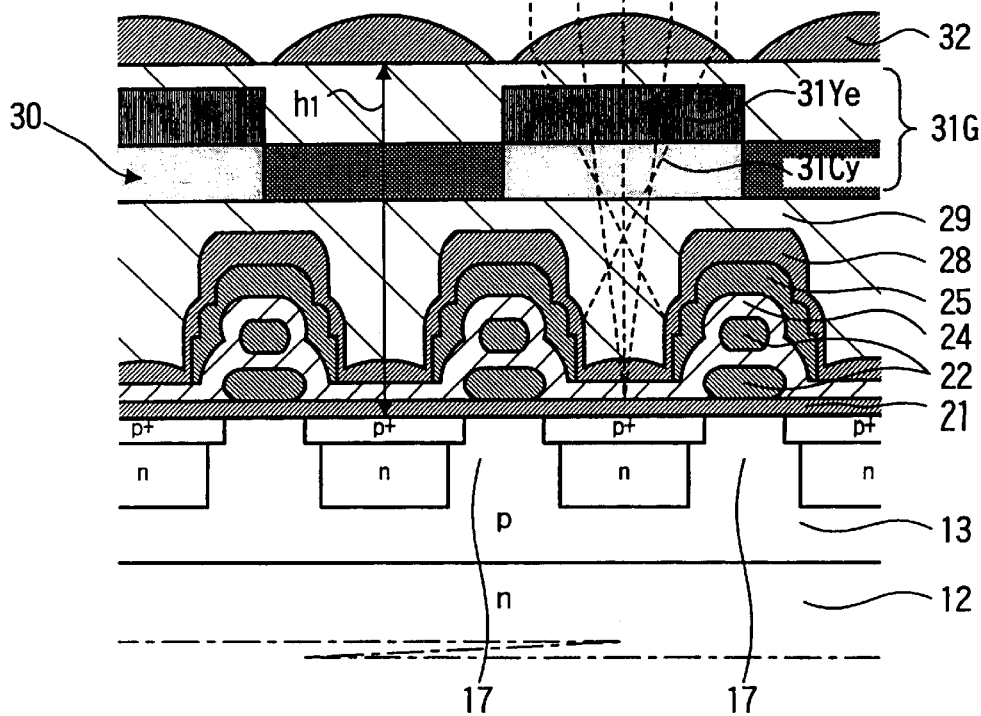
Figure 4:
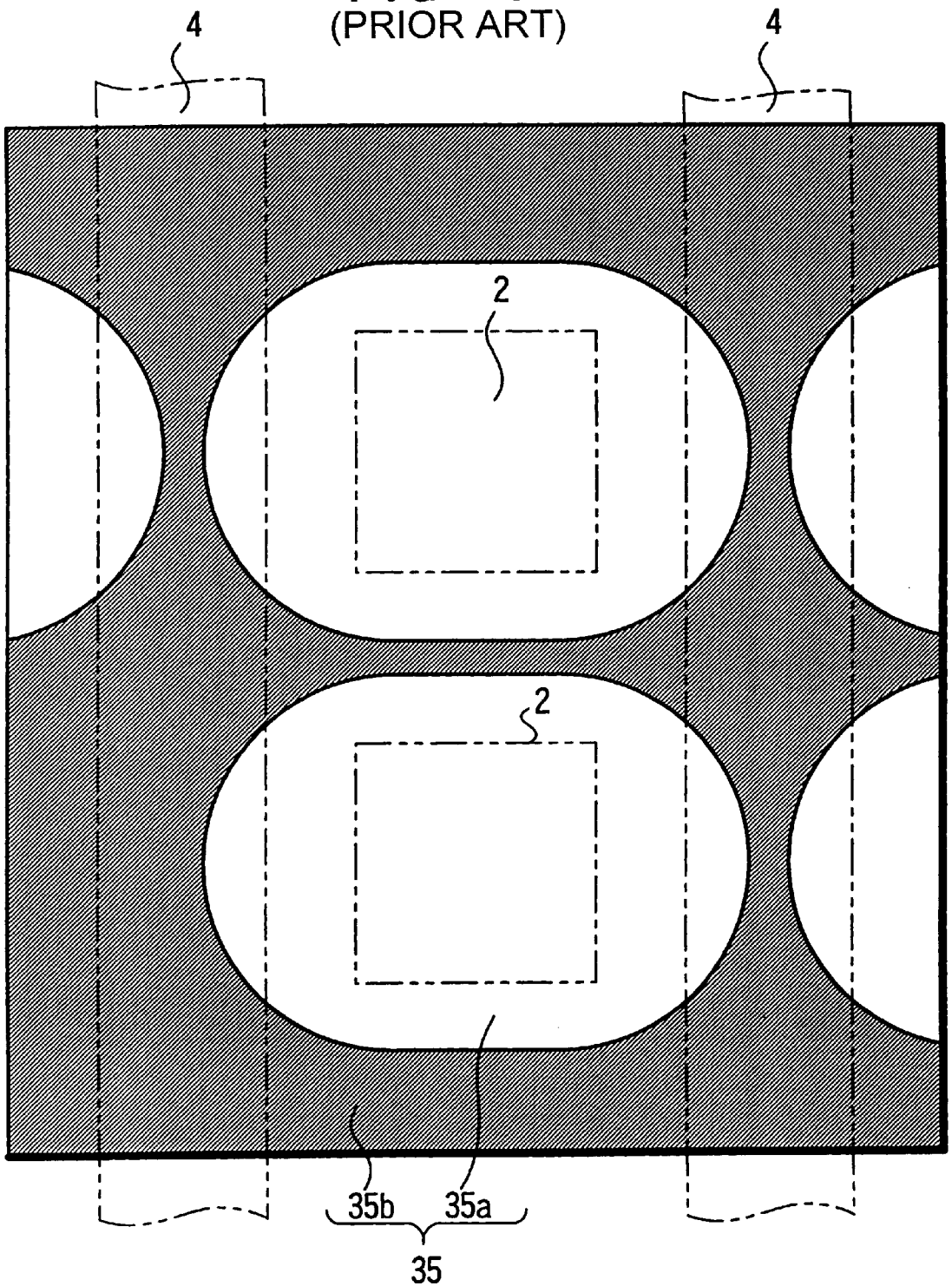
FIG. 4 is a plan view of FIGS. 3A and 3B.
Figure 5A:
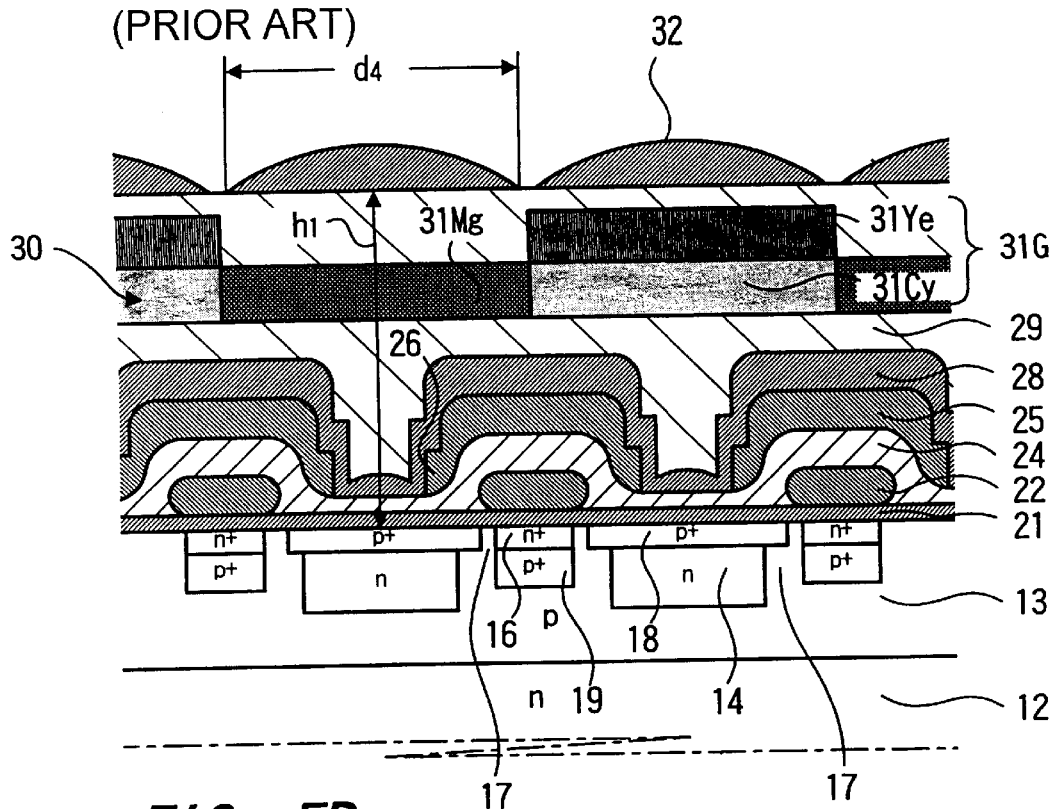
FIGS. 5A and 5B are manufacturing process diagrams of the solid state imaging device of FIG. 1 (showing sectional views of FIG. 6 in the horizontal direction and the vertical direction, respectively)
Figure 5B:
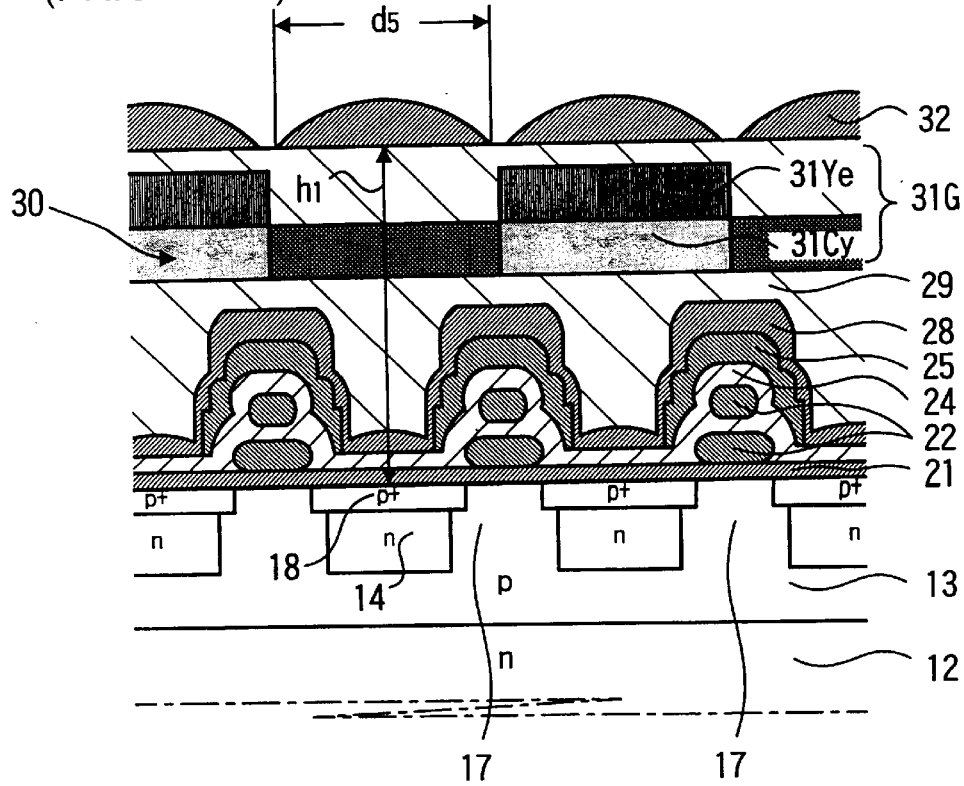

A solid state imaging device according to the present invention comprises a plurality of light receiving sections arranged in horizontal and vertical directions with different pitches, a foundation layer formed over the light receiving sections, and having convex portions on portions between the light receiving sections in a fine pitch direction and having concave portions at least along a straight line connecting centers of the light receiving sections in a coarse pitch direction, and a plurality of lenses formed on the concave portions so as to at least partially overlap on the convex portions in correspondence with the light receiving sections.

In the above-mentioned solid state imaging device according to the present invention, the foundation layer is formed in a stripe form continuing in the coarse pitch direction.

In the above-mentioned solid state imaging device according to the present invention, the foundation layer is formed in divisions in correspondence with the light receiving sections in the coarse pitch direction.

In the above-described solid state imaging device according to the present invention, the foundation layer is formed in divisions in correspondence with the respective light receiving sections in the coarse pitch direction, and a width of the foundation layer at both ends in the coarse pitch direction is set different from a width of in its central portion.

A solid state imaging device according to the present invention comprises a plurality of light receiving sections arranged in horizontal and vertical directions with different pitches, and a lens formed on each of the light receiving sections, and each of the lenses has a face to which transcribed is a face of an upper layer as a lens face thereof, the upper layer being formed in correspondence with the light receiving sections so as to extend over a foundation layer which has convex portions on portions between the light receiving sections in a five pitch direction and concave portions at least along a straight line connecting centers of the light receiving sections in a coarse pitch direction.

In accordance with the present invention, a method for manufacturing a solid state imaging device by forming lenses over a plurality of light receiving sections arranged in horizontal and vertical directions with different pitches comprises a first step process forming a foundation layer over the light receiving sections, the foundation layer having convex portions on portions between the light receiving sections in a fine pitch direction and having concave portions at least along a straight line connecting centers of the light receiving sections in a coarse pitch direction, and a second process for forming lenses on the concave portions so as to at least partially overlap on the convex portions in correspondence with the light receiving sections.

In the above-mentioned method for manufacturing a solid state imaging device according to the present invention, the first process includes a process for forming a film on an entire face over the light receiving sections, and a process for partially removing the film at least along a straight line connecting centers of the light receiving sections in a coarse pitch direction.

In the above-mentioned method for manufacturing a solid state imaging device according to the present invention, the first process includes a process for reflowing the film, after the partially film removing process.

In accordance with the present invention, a method for manufacturing a solid state imaging device by forming lenses over a plurality of light receiving sections arranged in horizontal and vertical directions with different pitches includes a first process for forming a lens material layer, a second process for forming a foundation layer over the lens material layer, the foundation layer having convex portions on portions between the light receiving sections in a fine pitch direction and concave portions at least along a straight line connecting centers of the light receiving sections in a coarse pitch direction, a third process for forming an upper layers on the concave portions so as to at least partially overlap on the convex portions in correspondence with the light receiving sections, and a fourth process for transcribing a lens face of the upper layer to the lens material layer by means of etch back to thereby forming lenses in correspondence with the light receiving sections.

Hereafter, embodiments of the present invention will be described by referring to drawing.

Figure 7:
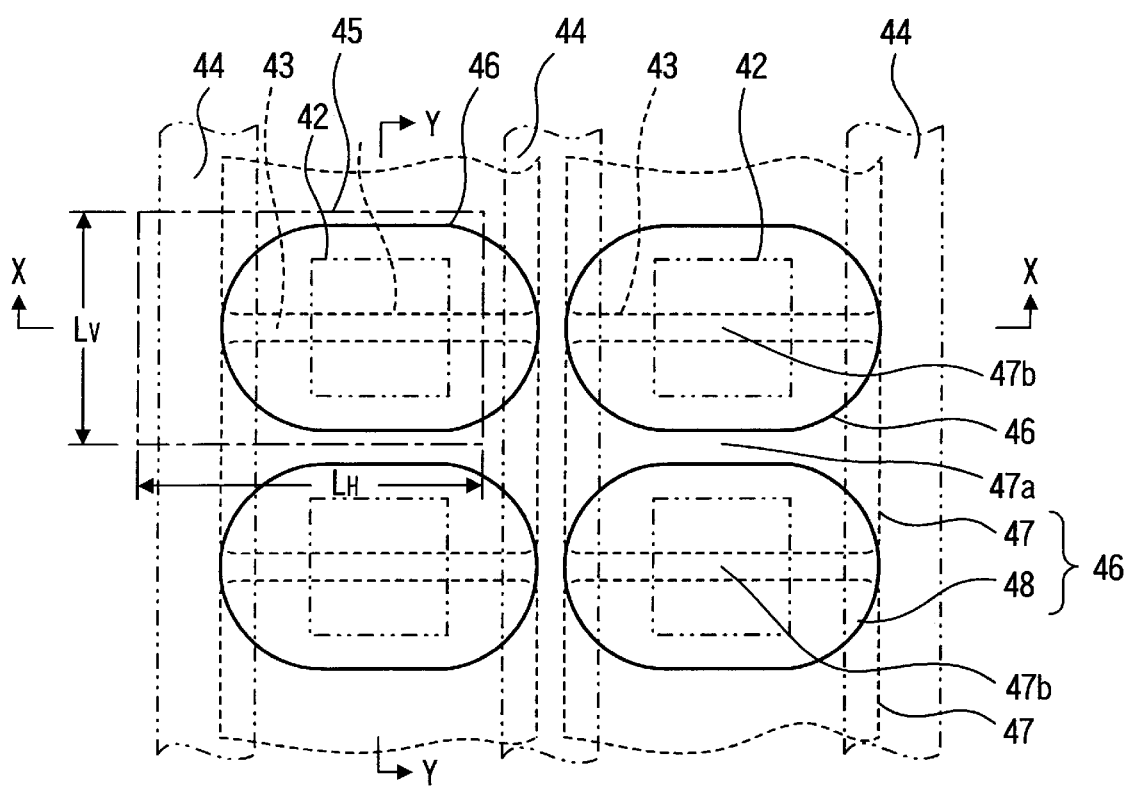
FIG. 7 is a plan view showing a first embodiment of a solid state imaging device according to the present invention.
Figure 8A:
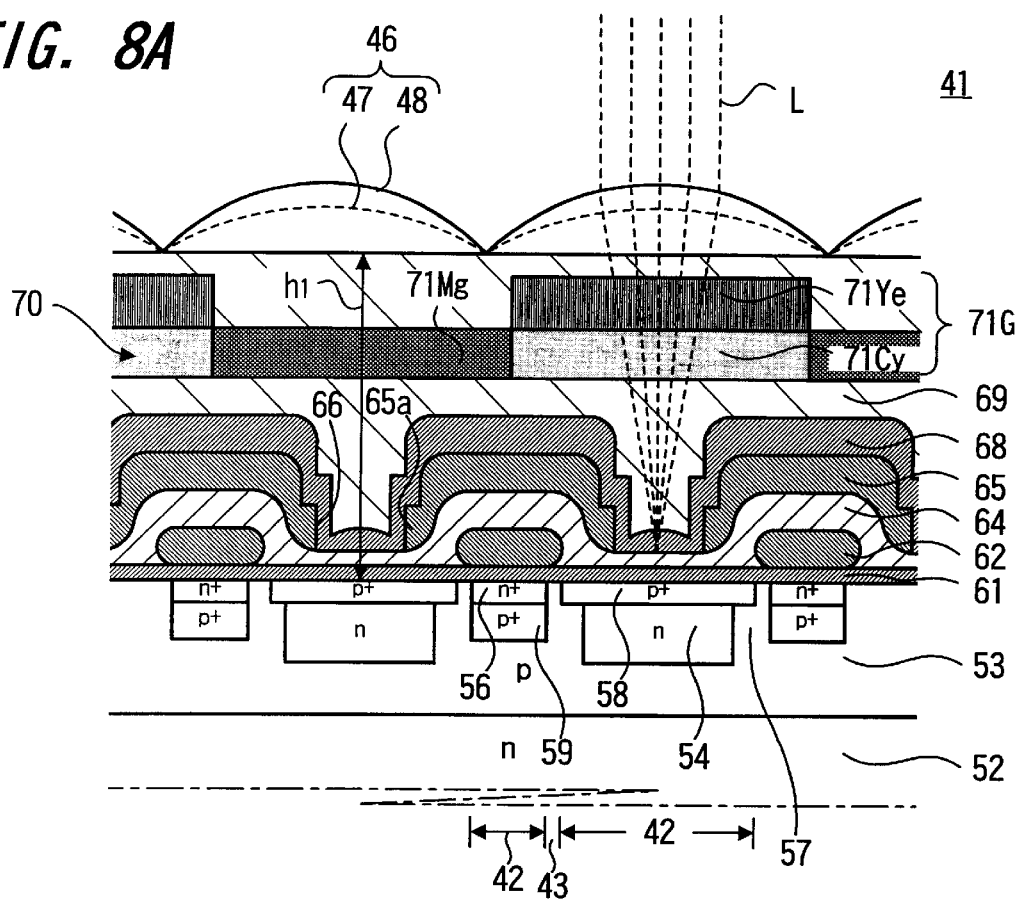
FIGS. 8A and 8B are sectional views along a line X—X and a line Y—Y of FIG. 7, respectively.
Figure 8B:
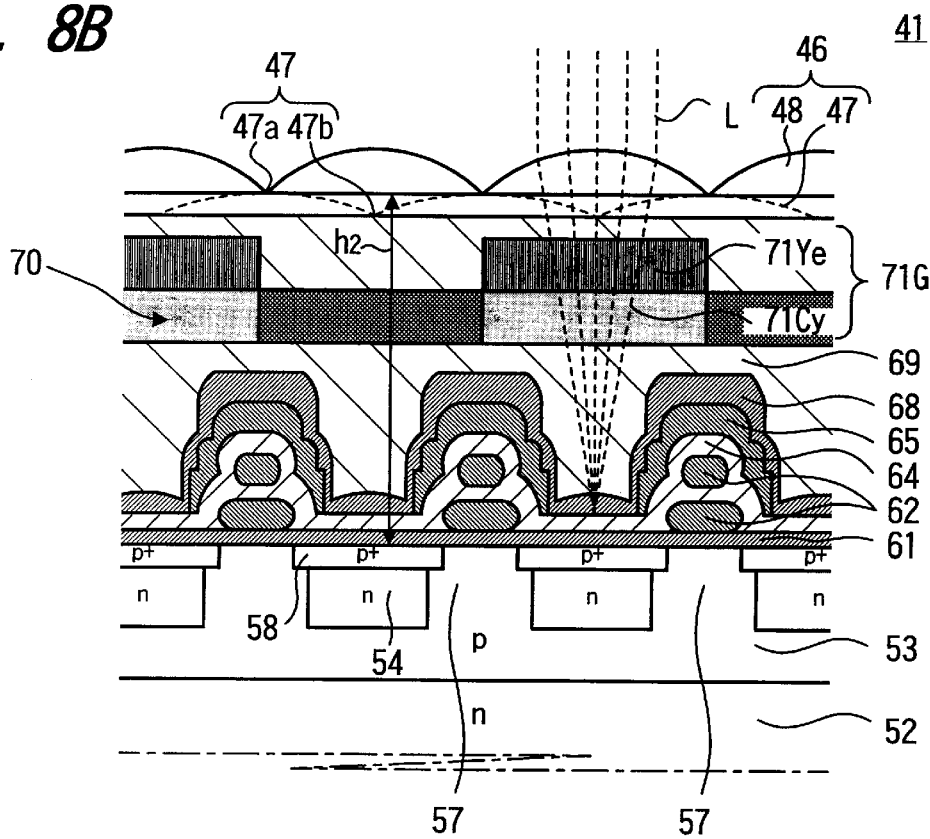

FIGS. 7, 8A and 8B show a first embodiment of the CCD solid state imaging device according to the present invention.

A CCD solid state imaging device 41 of the present embodiment has a configuration shown in FIG. 7. That is, in its imaging area, a plurality of light receiving sections 42 are arranged in a matrix form. On one side of each column of the light receiving sections 42, a vertical transfer register 44 having a CCD structure is formed via readout gate sections 43. In correspondence with each unit pixel 45, an on-chip micro-lens 46 having a composite structure and taking a nonspherical shape according to the present invention is formed on the light receiving section 42 of the unit pixel 45.

In this embodiment, the light receiving section 42 of the unit pixel 45 has an arrangement pitch in the horizontal direction different from that in the vertical direction. The pitch is coarse in the horizontal direction, and fine in the vertical direction. Assuming now that each unit pixel 5 has a length $L_H$ in the horizontal direction and a length $L_V$ in the vertical direction, the relation $L_H > L_V$ holds true and each unit pixel 45 takes a shape which is long in the horizontal direction. For example, $L_H$ is 5 μm and $L_V$ is 3 82 m.

The on-chip micro-lens 46 is formed by a foundation layer 47 taking the shape of a dome and a lens 48 of an upper layer existing on the foundation layer 47. The foundation layer 47 has a convex portion 47a between the light receiving sections 42 in the vertical direction, and an concave portion 47b along a straight line connecting centers of the light receiving sections 42 in the horizontal direction. The lens 48 of the upper layer is located on the concave portion 47b of the foundation layer 47 so as to partially overlap the convex portion 47a of the foundation layer 47, and serves substantially as an on-chip micro-lens having a nonspherical shape.

In this embodiment, the foundation layer 47 is formed so as to be divided in correspondence with each light receiving section 42, i.e., each pixel 45 in the horizontal direction.

FIGS. 8A and 8B show the sections of FIG. 7 along a line X—X in the horizontal direction and along a line Y—Y in the vertical direction, respectively.

In this CCD solid state imaging device 41, similar to the that described above, on a silicon substrate 52 of a first conduction type, such as, for example, n-type, a first well region 53 of a second conduction type, i.e., p-type is formed. In the first p-type well region 53, an n-type impurity diffusion region 54 and an n-type transfer channel region 56 constituting the vertical transfer register 44 are formed. Although not illustrated, a p-type channel stop region is formed in a pixel separation section 57 as occasion demands. On the n-type impurity diffusion region 54, a p-type positive charge storage area 58 is formed. Just under the n-type transfer channel region 56, a second p-type well region 59 is formed.

By the p-type well region 53, the n-type impurity diffusion region 54, and the p-type positive charge storage region 58, a so-called HAD (hole accumulated diode) sensor is formed. By this HAD sensor, the light receiving section 42 is formed.

Over the transfer channel region 56 constituting the vertical transfer register 44, the readout gate section 43, and the pixel separation section 57, a transfer electrode 62 comprising a first layer of polycrystal silicon and a second layer of polycrystal silicon is formed via a gate insulation film 61. By the transfer channel region 56, the gate insulation film 61, and the transfer electrode 62, the vertical transfer register 44 of the CCD structure is formed.

On the entire surface including the transfer electrodes 62, an inter-layer insulating film 64 is laminated. Furthermore, a light shield film 65 made of, for example, A1 is selectively formed so as to cover portion of the inter-layer insulating film 64 corresponding to the transfer electrodes 62.

In order to obstruct light (light incident obliquely) incident from the light receiving section 42 directly to the vertical transfer register 44, a projection 65a partially extending to the side of the light receiving section 42 is formed in the light shield film 65. In other words, an opening section 66 facing the light receiving section 42 is formed in the light shield film 65.

On the entire surface including the light shield films 65, a passivation film 68 is formed. Furthermore, a planarization film 69 is formed thereon. On the planarization film 69, a color filter layer 70 is formed. At a position on the color filter layer 70 corresponding to the light receiving section 42, the above described on-chip micro-lens 46 having a composite structure and a nonspherical shape is formed.

By the way, the color filter layer 70 is formed by a repetition of a pattern having a magenta color 71Mg, a cyan color 71Cy, a yellow color 71Ye, and a green color 71G arranged in a rectangle form bisected in both the vertical and horizontal directions. The green color 71G is formed by two layers of the cyan color 71Cy and the yellow color 71Ye.

In the present embodiment, the height measured from the silicon substrate to the on-chip micro-lens 46 is $h_1$ in the horizontal direction, whereas the height measured from the silicon substrate to the on-chip micro-lens 46 is $h_2$ in the vertical direction.

FIGS. 9A, 9B through 16 show an example of the method for manufacturing the above described CCD solid state imaging device 41, especially its on-chip micro-lens 46.

FIGS. 9A and 9B, FIGS. 11A and 11B, FIGS. 13A and 13B, and FIGS. 15A and 15B show sections in the horizontal direction and in the vertical direction for corresponding plan views of FIGS. 10, 12, 14, and 16, respectively.

Figure 9A:
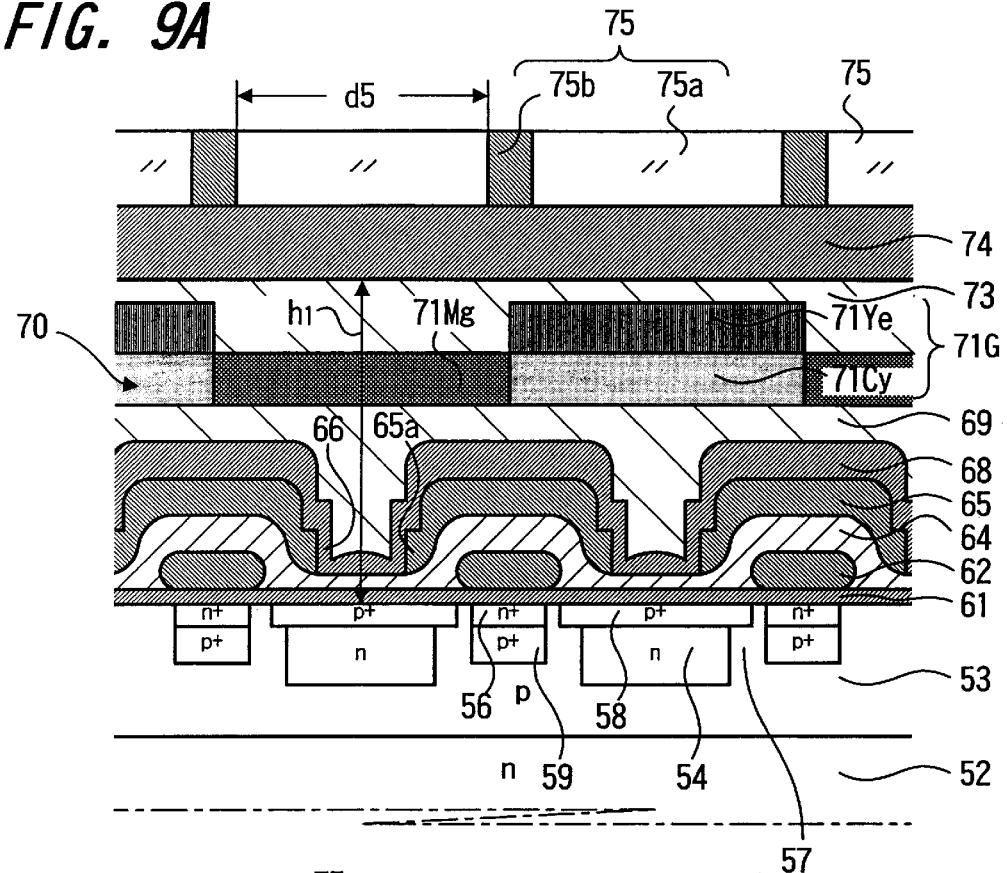
FIGS. 9A and 9B are manufacturing process diagrams of the solid state imaging device of FIG. 7 (showing sectional views of FIG. 10 in the horizontal direction and the vertical direction, respectively)
Figure 9B:
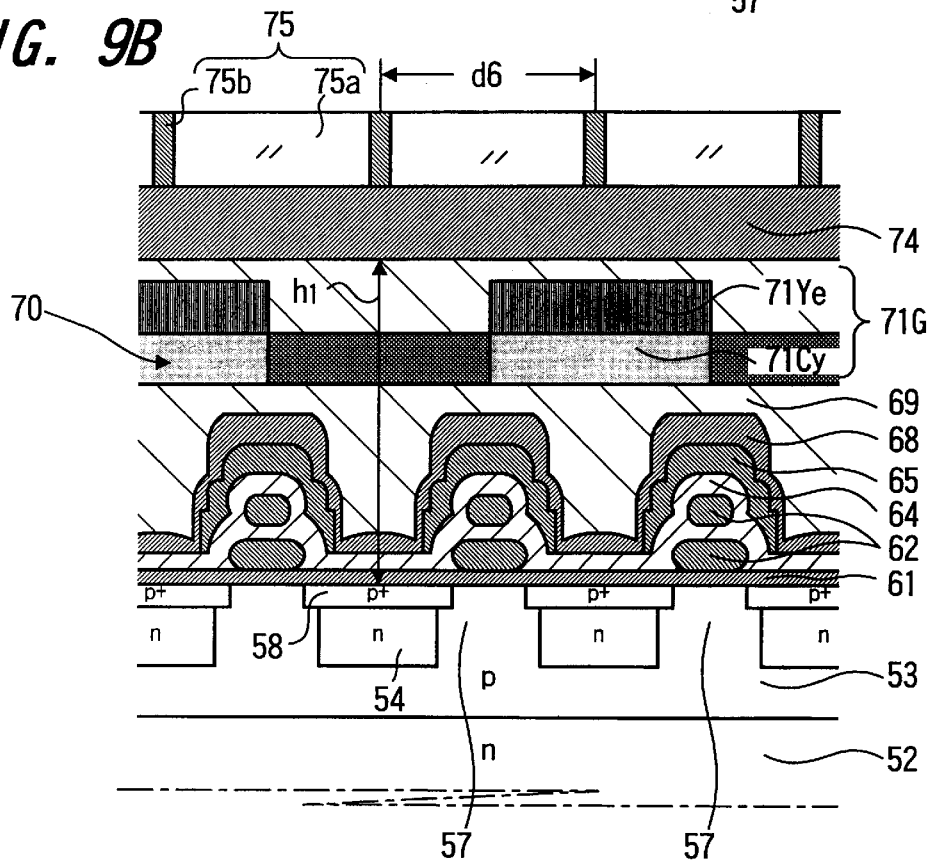
Figure 10:
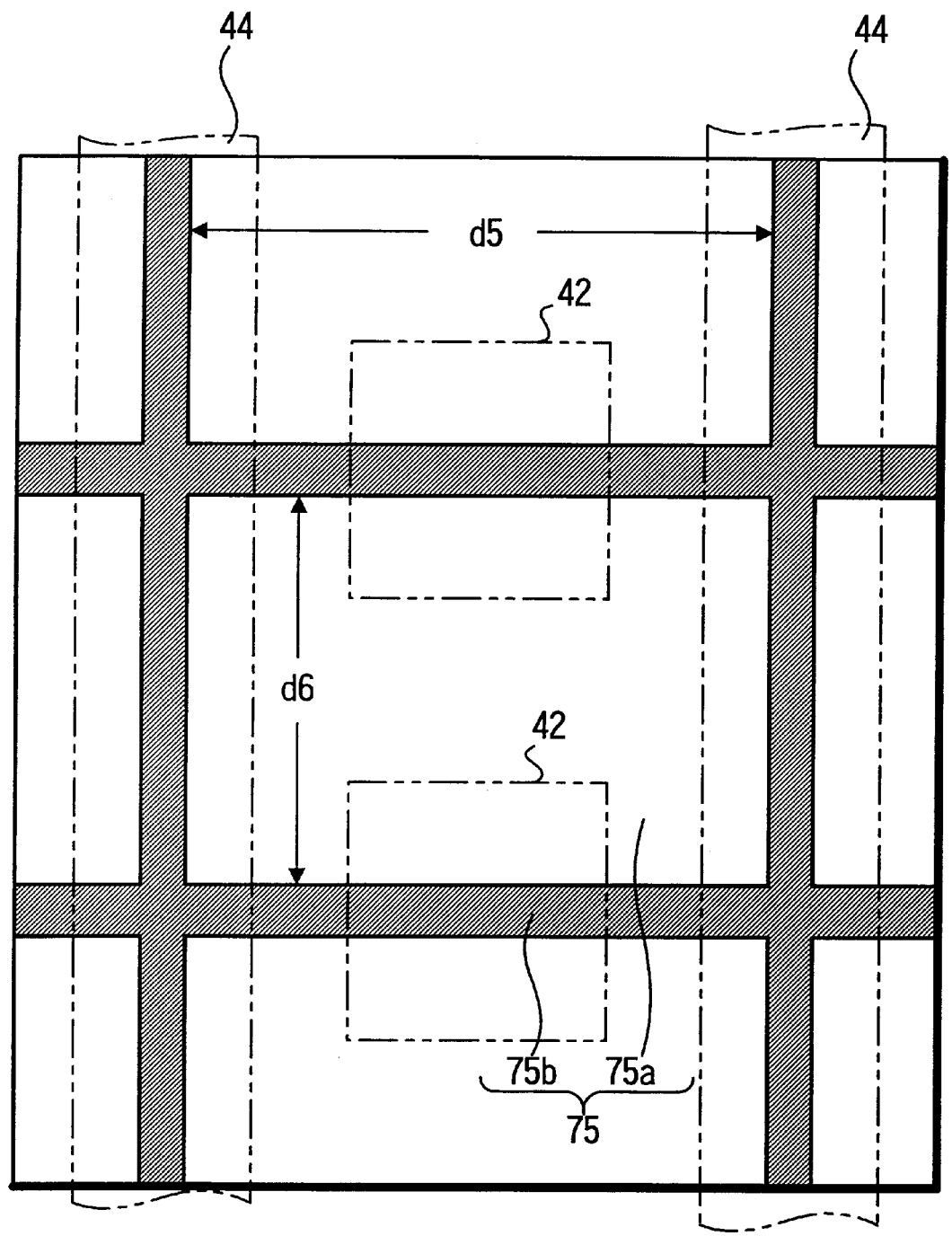
FIG. 10 is a plan view of FIGS. 9A and 9B.

First of all, the light receiving section 42, the vertical transfer register 44, the light shield film 65, and the color filter layer 70 are formed on the substrate 52 as shown in FIGS. 9A, 9B and 10. Thereafter, on the entire surface of the color filter layer 70, a first photoresist layer 74 of, for example, negative type functioning as a lens material is coated and formed via a planarization film 73. On the first photoresist layer 74, a first mask 75 is formed. The first mask 75 is formed of a light transmitting section 75a separated into a rectangle, and a light shield sections 75b located between adjacent light transmitting sections 75a.

As for the rectangular light transmitting section 75a of the first mask 75, the center of its light transmitting section pattern in the vertical direction is located not just above the light receiving section 42, but is located above the pixel separation section 57 between the light receiving sections 42. The both ends of the rectangular light transmitting section 75a in the vertical direction overlap on parts of adjacent light receiving sections 42 in the vertical direction, respectively. As for the horizontal direction, the rectangular light transmitting section 75a is located so as to correspond to the pixel. Denoting the length of the rectangular light transmitting section 75a in the horizontal direction and in the vertical direction respectively by $d_5$ and $d_6$, the rectangular light transmitting section 75a is formed so as to satisfy the relation $d_5 > d_6$.

Light is irradiated via the first mask 75 on the first photoresist layer 74 to be exposed.

Figure 11A:
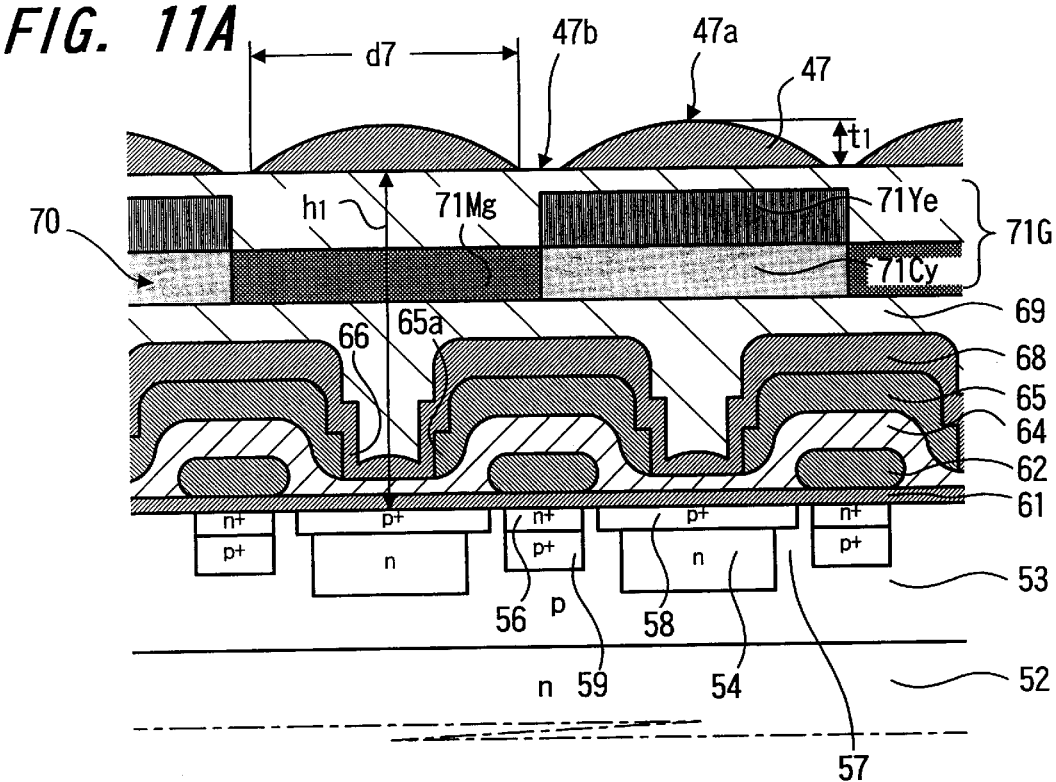
FIGS. 11A and 11B are manufacturing process diagrams of the solid state imaging device of FIG. 7 (showing sectional views of FIG. 12 in the horizontal direction and the vertical direction, respectively)
Figure 11B:
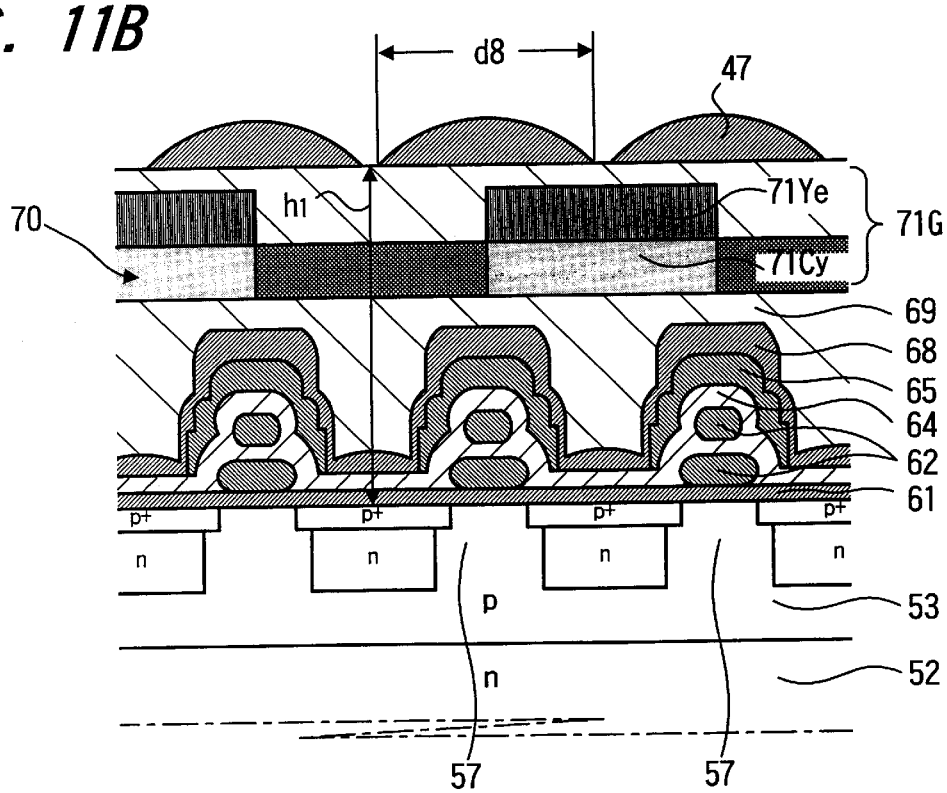
Figure 12:
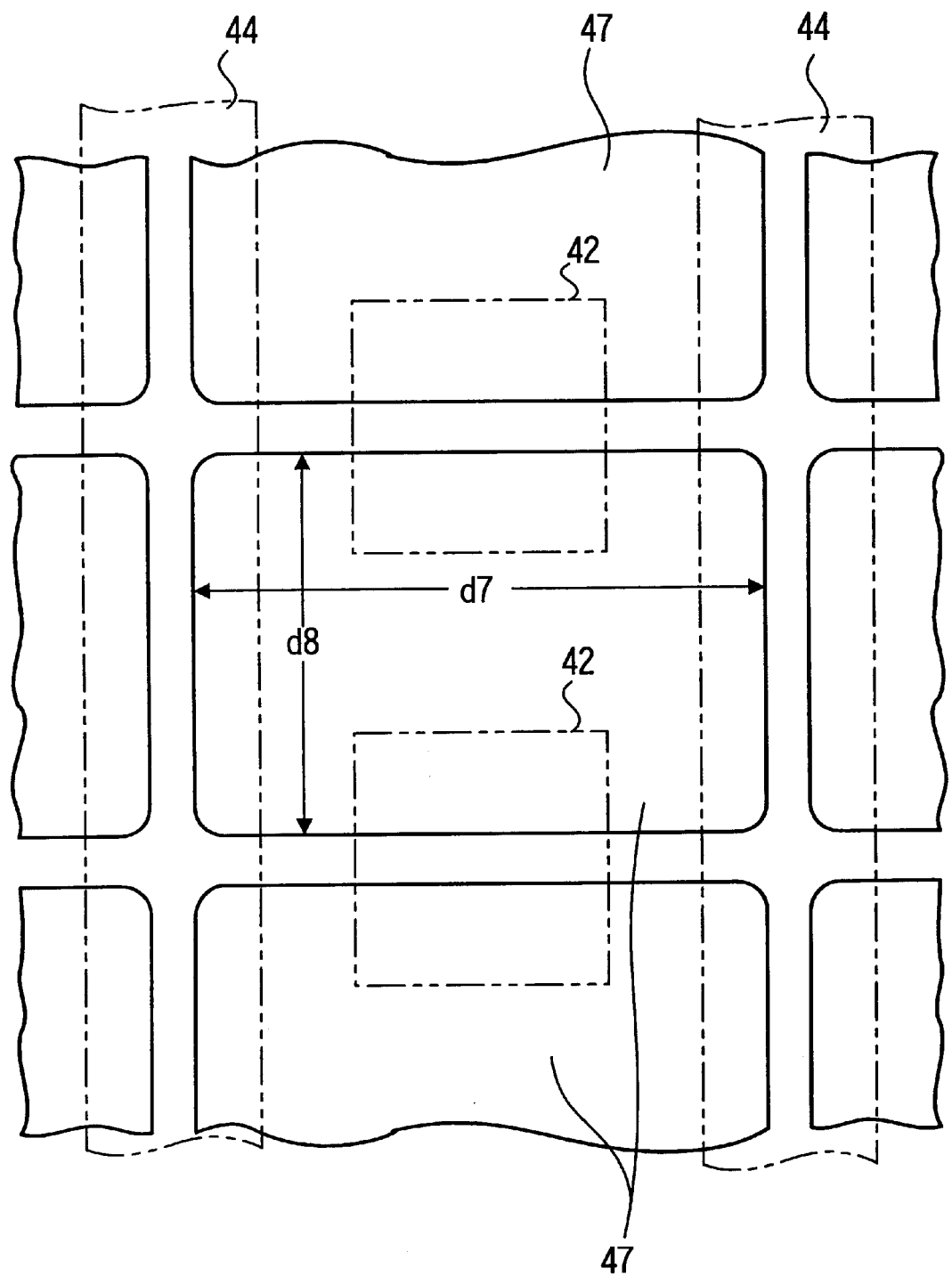
FIG. 12 is a plan view of FIGS. 11A and 11B.

Subsequently, as shown in FIGS. 11A, 11B and 12, development is conducted so as to remove areas of the photoresist which have not yet been exposed to light. Thereafter, reflow is effected on the photoresist by heat treatment to form the dome-shaped foundation layer, i.e., lens layer 47 of the first layer. Thereafter, heat treatment at approximately 100 to 150° C. for 30 to 300 seconds, for example, is conducted in the atmosphere under the normal pressure to fix the shape.

The lens layer 47 of the first layer is formed so as to have a thin thickness $t_1$. If the conventional on-chip micro-lens has a thickness $t_2$ of, for example, 1.0 μm, the thickness $t_1$ of the lens layer 47 of the first layer is set equal to, for example, 0.6 μm.

When seen as a whole, the lens layer 47 of the first layer has its convex portion 47a between the light receiving sections 42 in the vertical direction, i.e., on the pixel separation section 57, and has its concave portion 47b along a straight line connecting centers of the light receiving sections 42 in the horizontal direction.

The length of the lens layer 47 of the first layer in the horizontal direction is denoted by $d_7$. The length of the lens layer 47 of the first layer in the vertical direction is denoted by $d_8$. The relation $d_8 < d_7$ holds true.

Figure 13A:
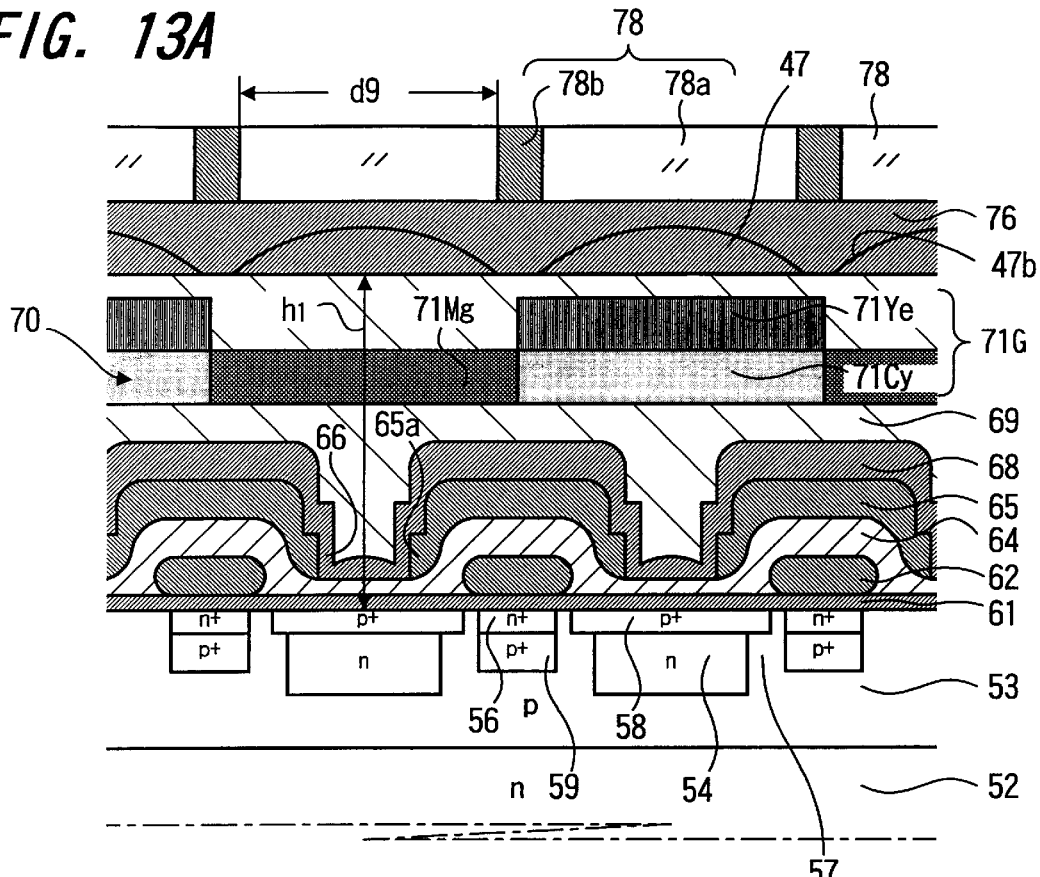
FIGS. 13A and 13B are manufacturing process diagrams of the solid state imaging device of FIG. 7 (showing sectional views of FIG. 14 in the horizontal direction and the vertical direction, respectively)
Figure 13B:
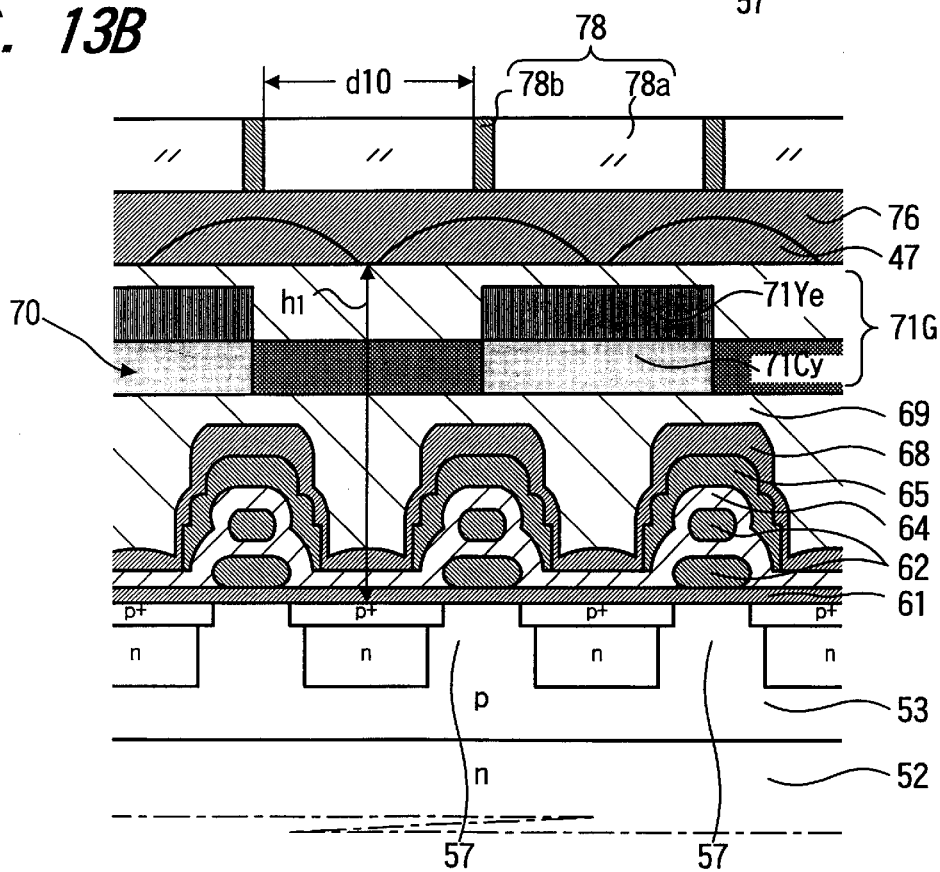
Figure 14:
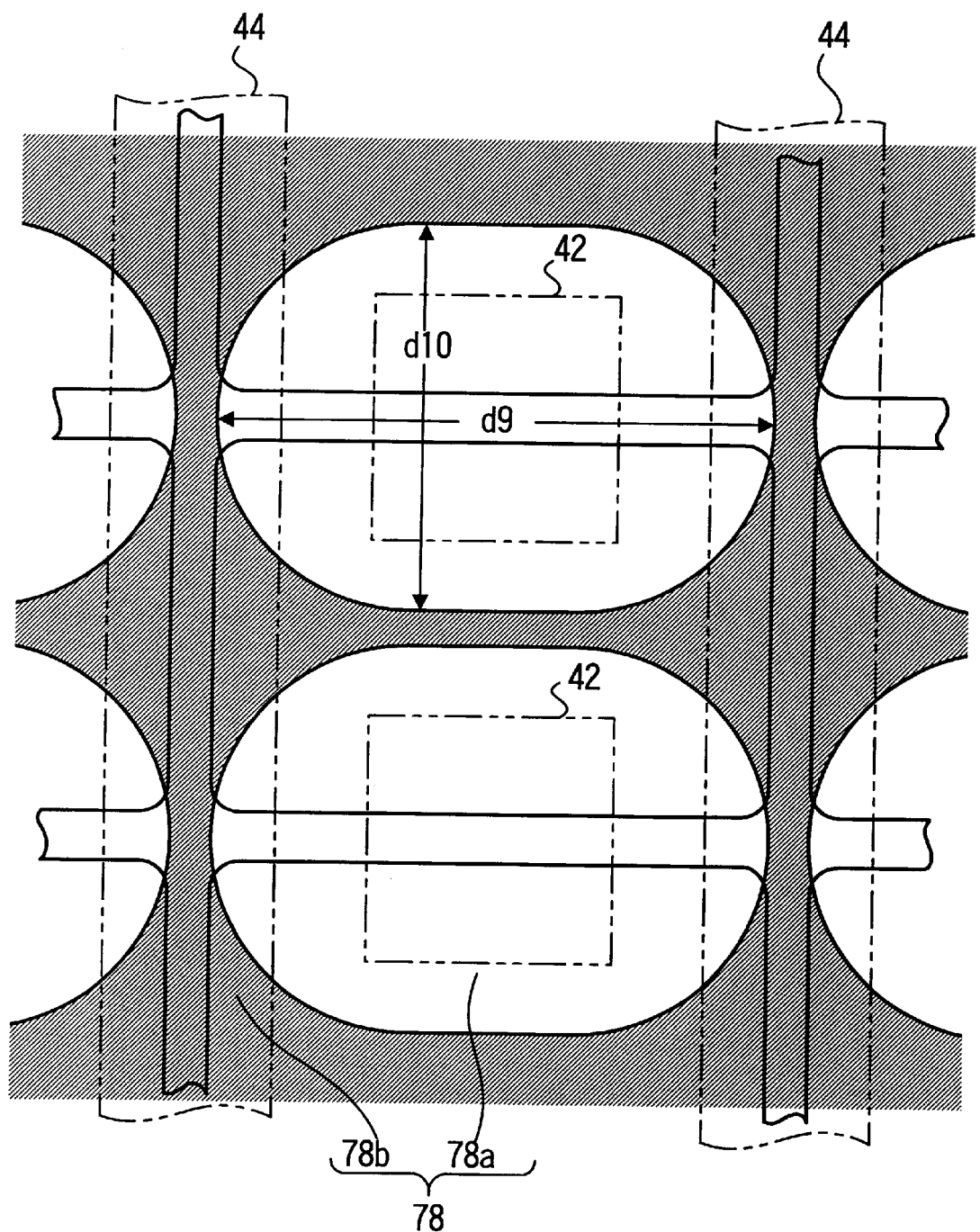
FIG. 14 is a plan view of FIGS. 13A and 13B.

Subsequently, as shown in FIGS. 13A, 13B and 14, a second photoresist layer 76 of, for example, a negative type is formed on the lens layer 47 of the first layer so as to fill up its concave portions 47b and form a lens material having a predetermined thickness over the entire surface. On the second photoresist layer 76, there is formed a second mask 78 including light transmitting sections 78a separated into shapes which are long in the lateral direction and light shield sections 78b located between the adjacent light transmitting sections 78a.

As for the light transmitting section 78a of the second mask 78, the center of the pattern of each light transmitting section 78a in the vertical direction corresponds to the center of the light receiving section 42. As a whole, the light transmitting sections 78a are formed at positions corresponding to respective pixels around the light receiving sections 42. In the illustrated example, the light transmitting section 78a takes a shape which is long in the horizontal direction and which has circular arcs at both ends in the horizontal direction.

The length of each of the light transmitting sections 78a of the second mask 78 is denoted by $d_9$. Its length in the vertical direction is denoted by $d_{10}$. The relation $d_{10} < d_9$ holds true.

Light is irradiated via the second mask 78 on the second photoresist layer 76 to expose the same to light.

Figure 15A:
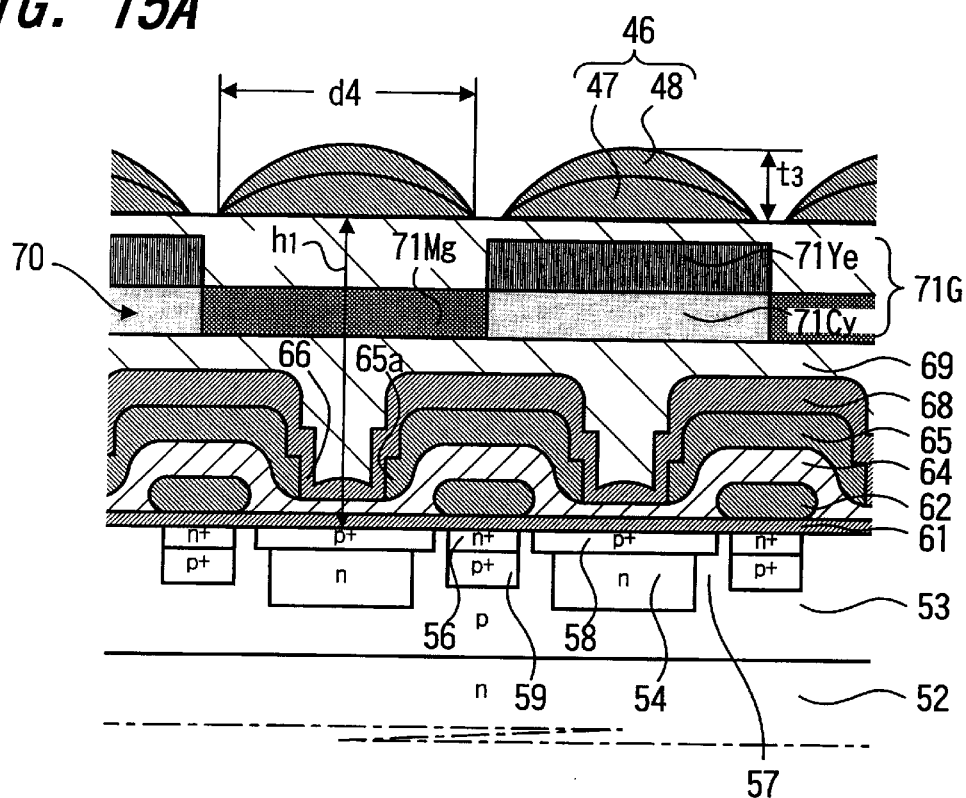
FIGS. 15A and 15B are manufacturing process diagrams of the solid state imaging device of FIG. 7 (showing sectional views of FIG. 16 in the horizontal direction and the vertical direction, respectively)
Figure 15B:
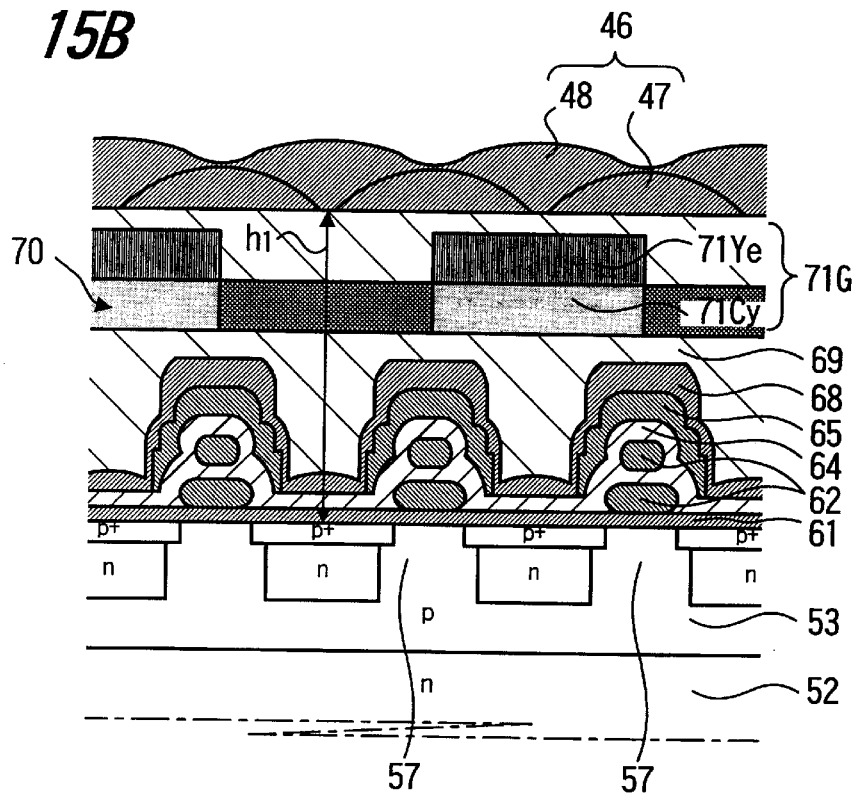
Figure 16:
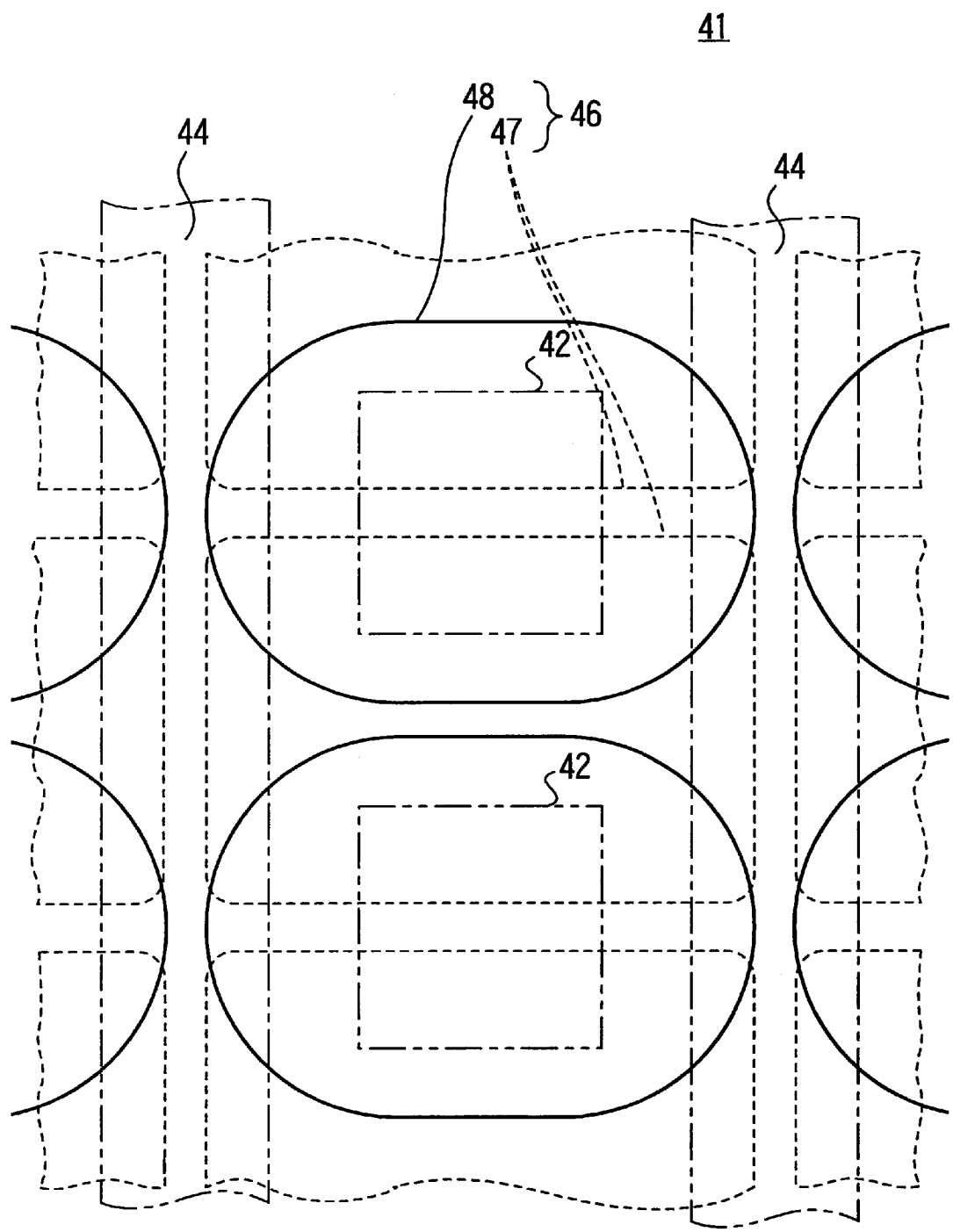
FIG. 16 is a plan view of FIGS. 15A and 15B.
Figure 17A:
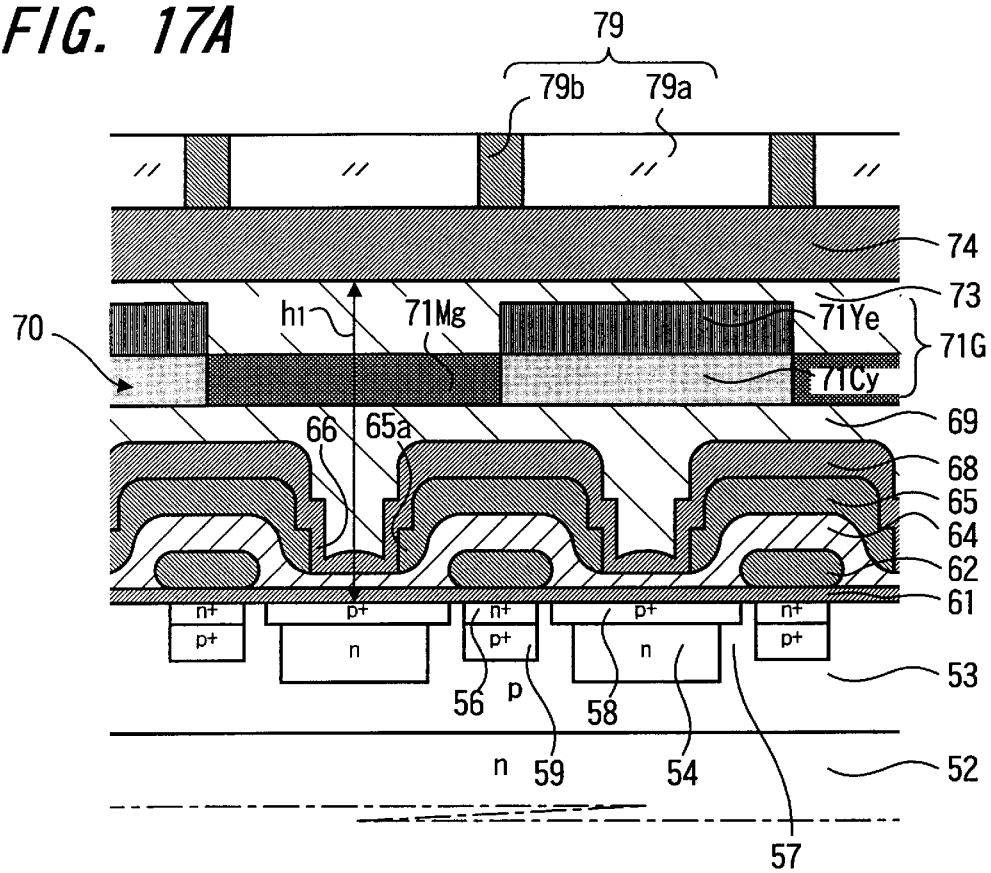
FIGS. 17A and 17B are manufacturing process diagrams of a second embodiment of the solid state imaging device according to the present invention (showing sectional views of FIG. 18 in the horizontal direction and the vertical direction, respectively)
Figure 17B:
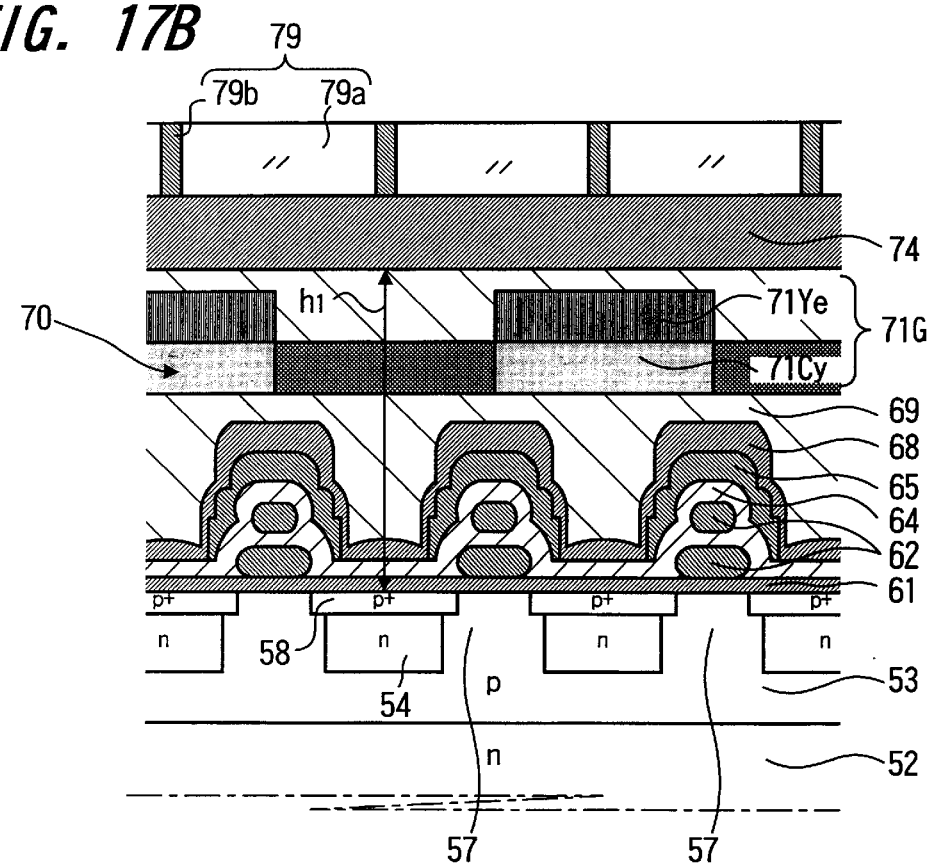

Subsequently, as shown in FIGS. 15A, 15B and 16, development is conducted so as to remove areas of the second photoresist layer 76 which have not yet been exposed to light. Thereafter, reflow is effected on the remained photoresist by heat treatment to form the lens layer 48 of the second layer. The lens layer 48 of the second layer fills up the lower portion of the lens layer 47 of the first layer, i.e., the concave portion 47b, and becomes a convex portion in the concave portion 47b. By high viscosity of the lens material, the planarization property is low. As a result of such delicate balance, a nonspherical lens layer as shown in FIGS. 15A and 15B is obtained. The total thickness t3 of the first and second lens layers 47 and 48 can be set equal to, for example, 1.0 μm.

By the lens layer 47 of the first layer serving as the foundation layer and the lens layer 48 of the second layer serving as a substantial lens, the target on-chip micro-lens 46 is formed and the desired CCD solid state imaging device 41 is obtained.

In the first embodiment described above, the first lens layer 47 has the convex portion 47a in the pixel separation section 57 between the light receiving sections 42 in the vertical direction, and has the concave portion 47b along a straight line connecting centers of the light receiving sections 42. The first lens layer 47 functions as the foundation layer separated in correspondence with each pixel. The second lens layer 48 is formed so as to fill up the concave portion 47b, partially overlap on the convex portion 47a, and have a convex portion at the center of the light receiving section on the concave portion 47b. By the first lens layer 47 and the second lens layer 48, the on-chip micro-lens 46 is formed. As a result, the second lens layer 48 serving as a substantial on-chip micro-lens becomes a nonspherical lens. In the case where the size of the unit pixel in the horizontal direction is different from that in the vertical direction, the focusing efficiency can be made optimum in both the horizontal and vertical directions when the light L is incident on the light receiving section as shown in FIGS. 8A and 8B.

As a result, the imaging characteristics such as the sensitivity, smear and so on in the CCD solid state imaging device can be improved.

In addition, the uniformity of the output between a small light quantity and a large light quantity is improved irrespective of the sensitivity and light quantity.

FIGS. 17A and 17B through 20 show a second embodiment of the CCD solid state imaging device according to the present invention.

Figure 18:
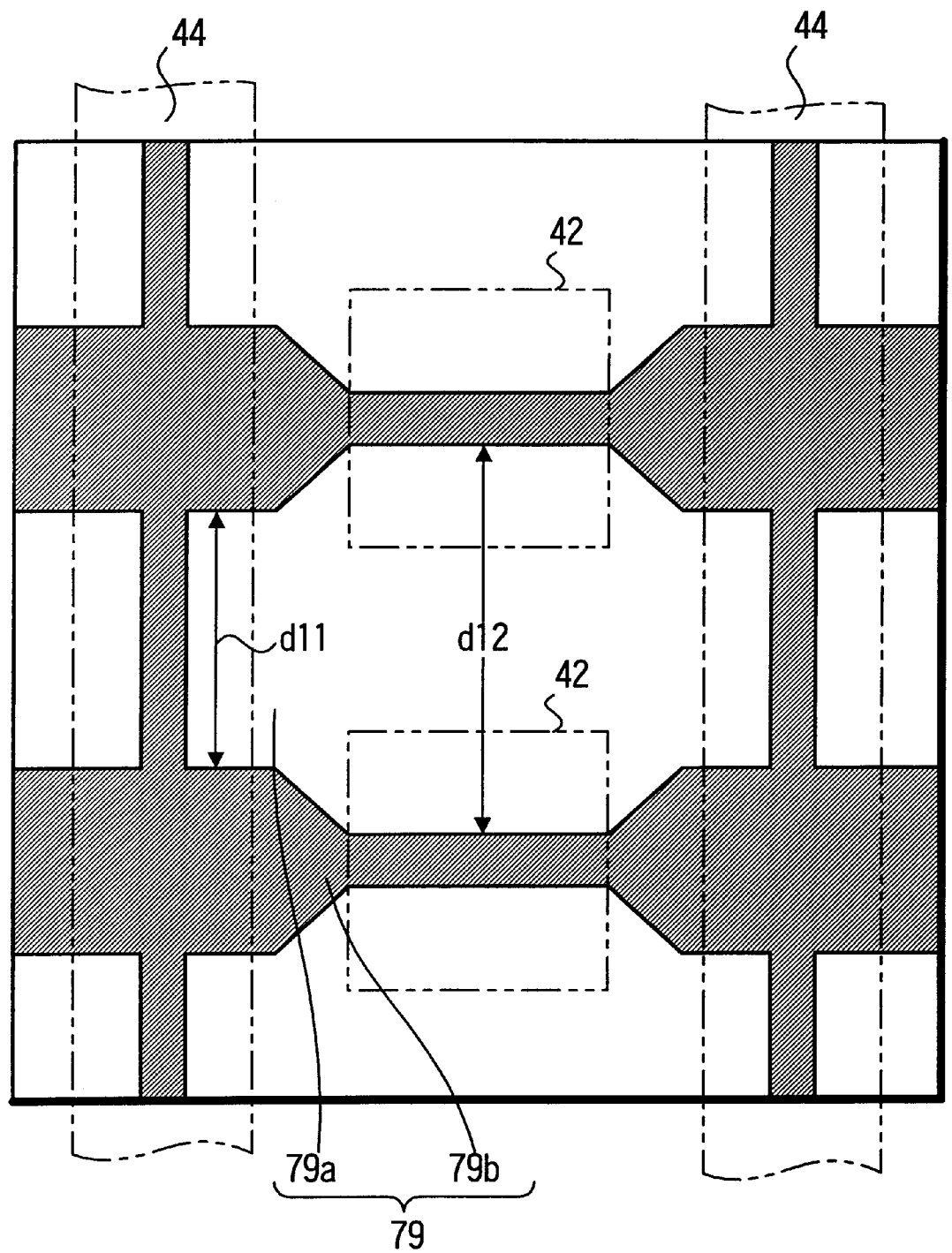
FIG. 18 is a plan view of FIGS. 17A and 17B.
Figure 19A:
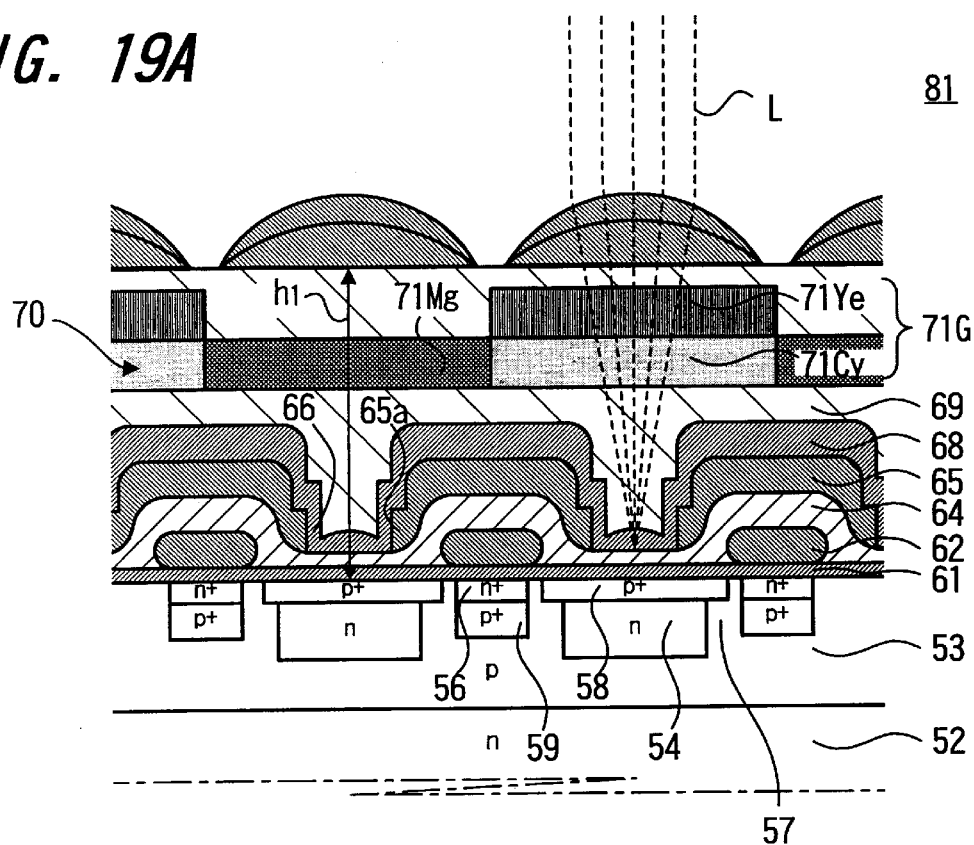
FIGS. 19A and 19B are manufacturing process diagrams of the second embodiment of the solid state imaging device according to the present invention (showing sectional views of FIG. 20 in the horizontal direction and the vertical direction, respectively)
Figure 19B:
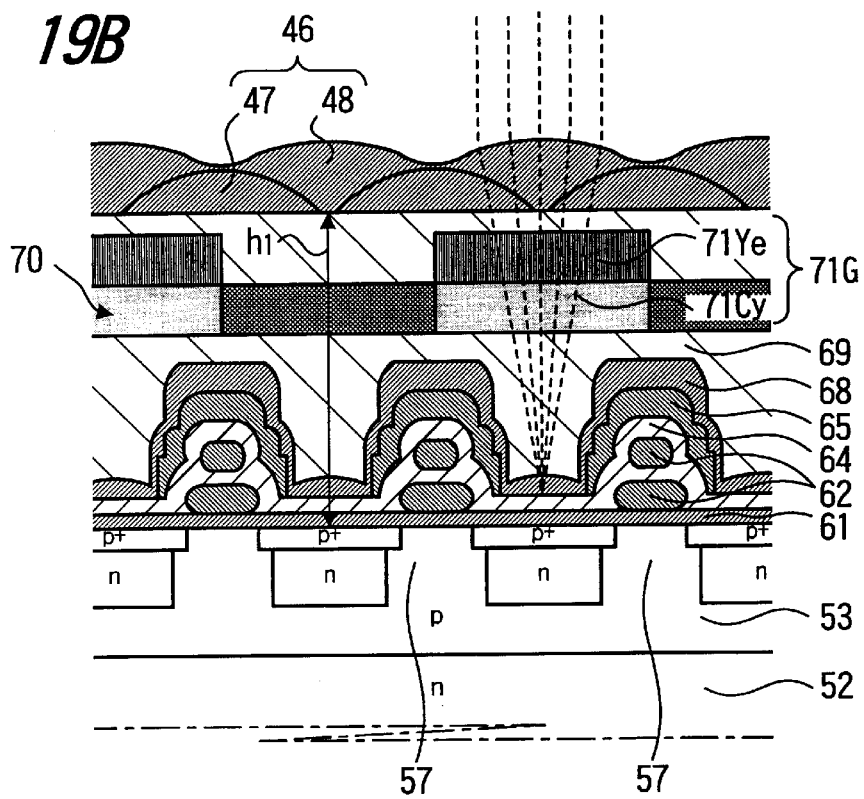
Figure 20:
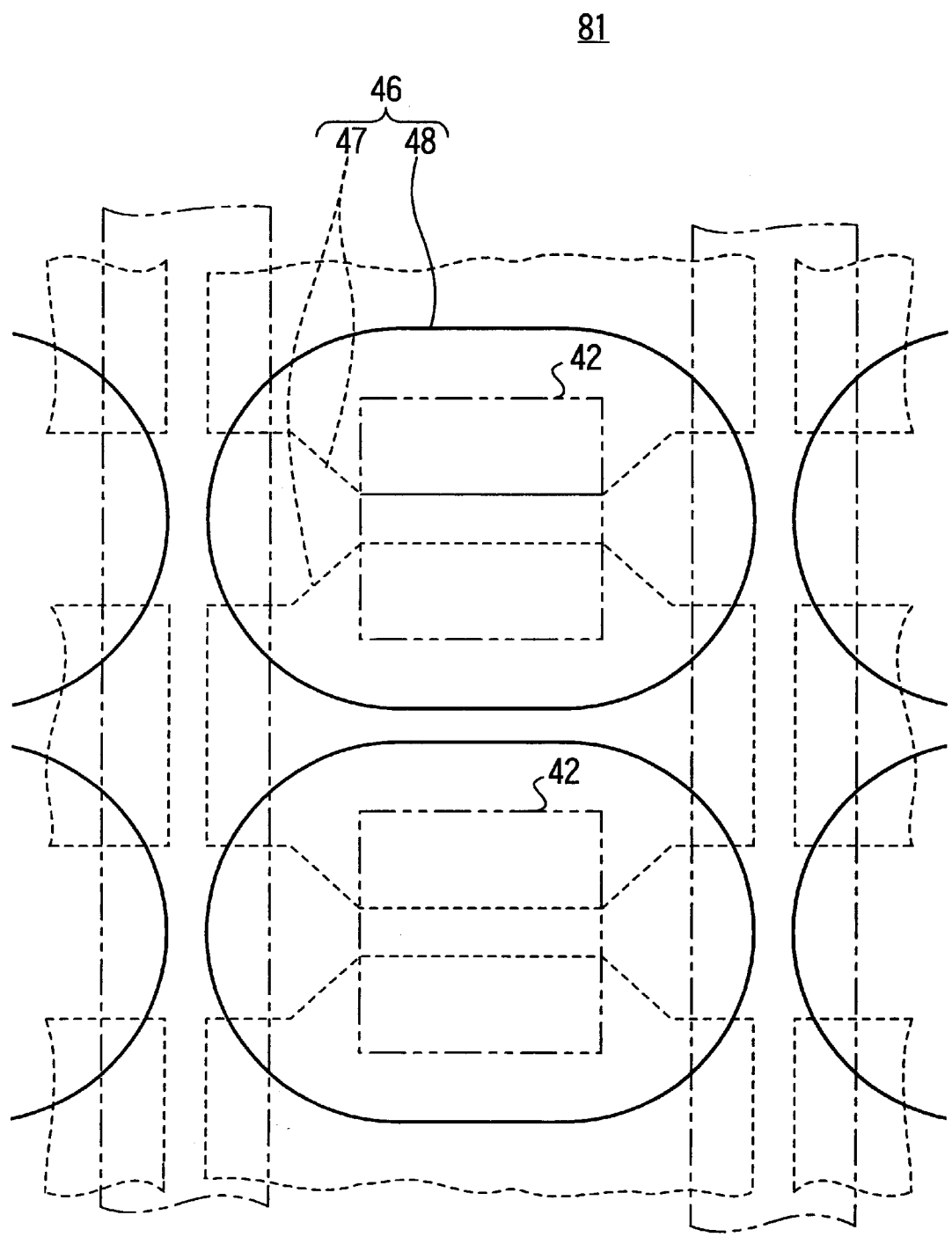
FIG. 20 is a plan view of FIGS. 19A and 19B.

FIGS. 17A and 17B, and FIGS. 19A and 19B show sections in the horizontal direction and in the vertical direction for corresponding plan views of FIGS. 18 and 20, respectively.

In the present embodiment, when the first photoresist layer 74 of, for example, a negative type serving as the lens material is exposed to light via a first mask 79 including a light transmitting section 79a and a light shield section 79b, the exposure pattern is not rectangular as shown in FIG. 10, but exposure is conducted so that a width at both ends in the horizontal direction, i.e., a width $d_{11}$ in the vertical direction may become smaller than a width $d_{12}$ between central light receiving sections. Thereafter, the same process as that described with reference to FIGS. 11A and 11B through 16 is conducted. Eventually, the on-chip micro-lens 46 is formed by the lens layer 47 of the first layer serving as the foundation layer and the lens layer 48 of the second layer serving as a substantial lens as shown in FIGS. 19A, 19B and 20. A CCD solid state imaging device 81 having the on-chip micro-lens 46 is thus obtained. In FIGS. 17A and 17B through 20, components corresponding to those in FIGS. 9A and 9B through 16 are denoted by like numerals and duplicated description thereof will be omitted.

In this CCD solid state imaging device 81, the width $d_{11}$ of the lens layer 47 of the first layer at both ends in the horizontal direction is narrower than the central width $d_{12}$. Therefore, the curvature of the on-chip micro-lens 46 in the diagonal direction of the opening of the light receiving section becomes large. As a result, the synthetic focusing efficiency incorporating not only the horizontal and vertical directions but also the diagonal direction can be improved.

Although not illustrated, the foundation layer 47 may have such a pattern that the width at both ends in the horizontal direction is set to be greater than the central width on the contrary to the above described example.

Figure 21:
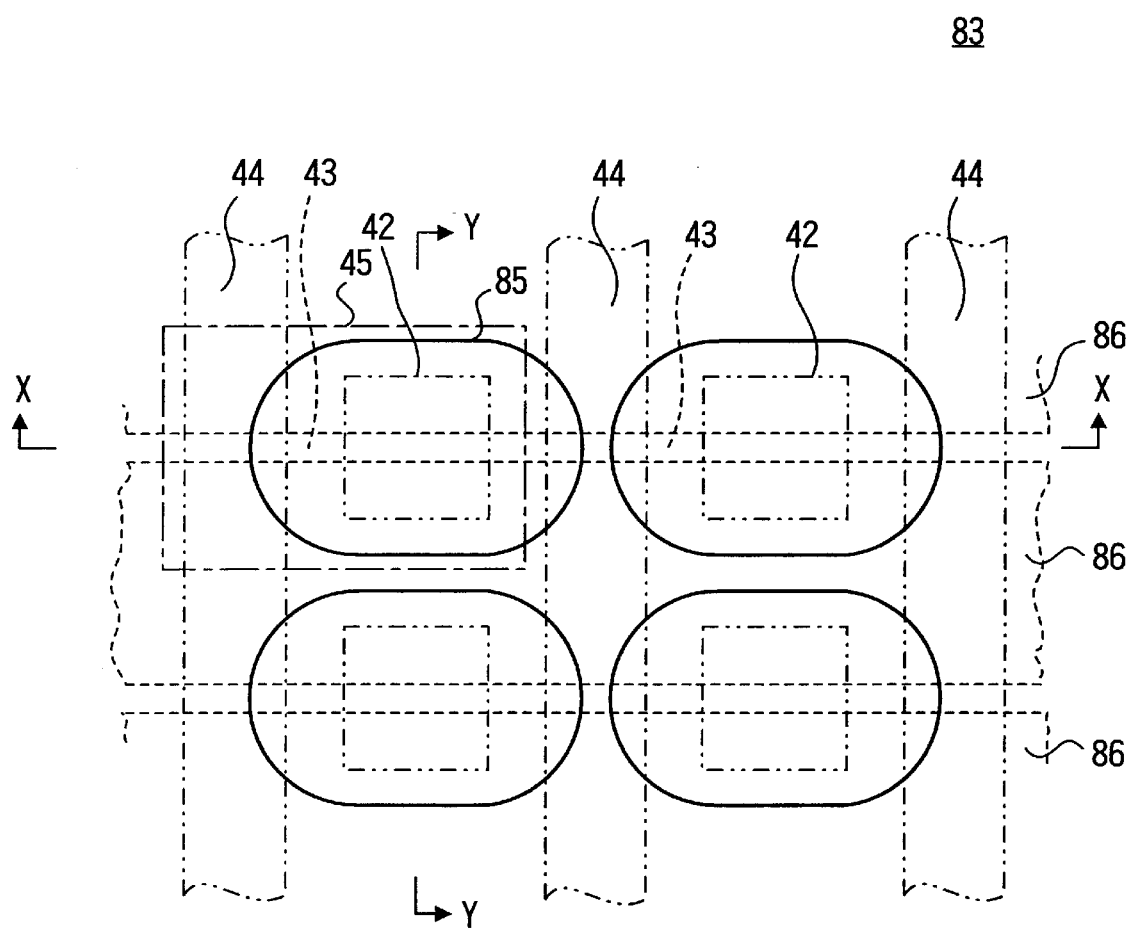
FIG. 21 is a plan view of a third embodiment of the solid state imaging device according to the present invention.
Figure 22A:
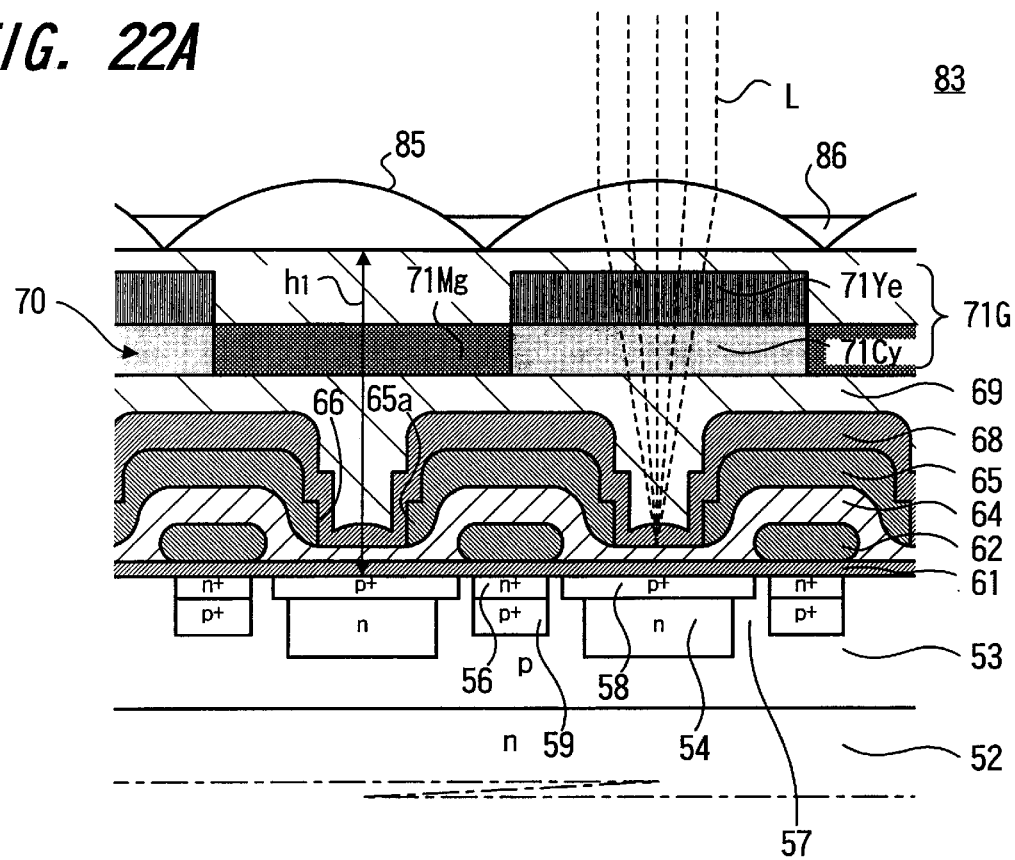
FIGS. 22A and 22B are sectional views along a line X—X and a line Y—Y of FIG. 21, respectively.
Figure 22B:
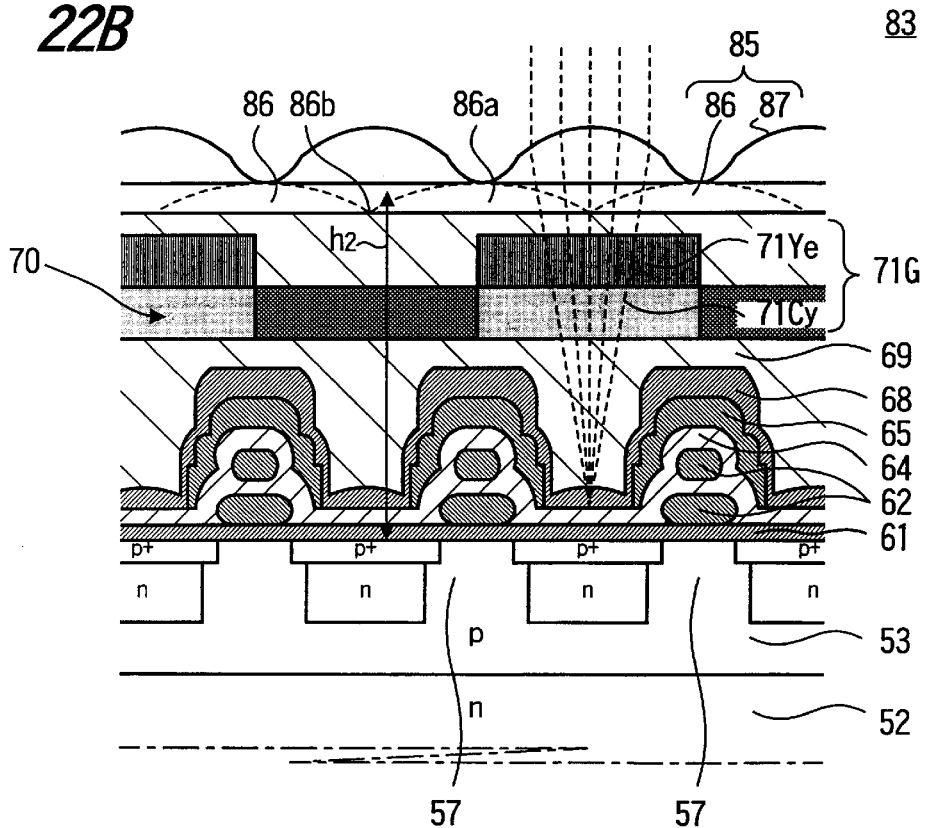

FIGS. 21, 22A and 22B show a third embodiment of the CCD solid state imaging device according to the present invention.

A CCD solid state imaging device 83 of the present embodiment has a configuration shown in FIG. 21. In its imaging area, a plurality of light receiving sections 42 are arranged in a matrix form in the same way as the foregoing description. On one side of each column of the light receiving sections 42, a vertical transfer register 44 having a CCD structure is formed via a readout gate section 43. In correspondence with each unit pixel 45, an on-chip micro-lens 85 having a composite structure and taking a nonspherical shape is formed on the light receiving section 42 of the unit pixel 45.

As apparent from FIGS. 21, 22A and 22B, the on-chip micro-lens 85 is formed by a stripe-shaped foundation layer 86 continuing in the horizontal direction and a substantial lens 87 taking a nonspherical shape. The foundation layer 86 has a convex portion 86a in the pixel separation section between the light receiving sections in the vertical direction. The substantial lens 87 is formed between the stripe-shaped foundation layers 86, i.e., on the concave portion 86b along a straight line connecting centers of the light receiving sections 42 so as to correspond to each pixel and partially overlap on the convex portion 86a of the foundation layer 86.

FIGS. 22A and 22B show sections of FIG. 21 in the horizontal direction and in the vertical direction, respectively. In FIGS. 22A and 22B, components corresponding to those in FIGS. 8A and 8B are denoted by like numerals and duplicated description thereof will be omitted.

Figure 23A:
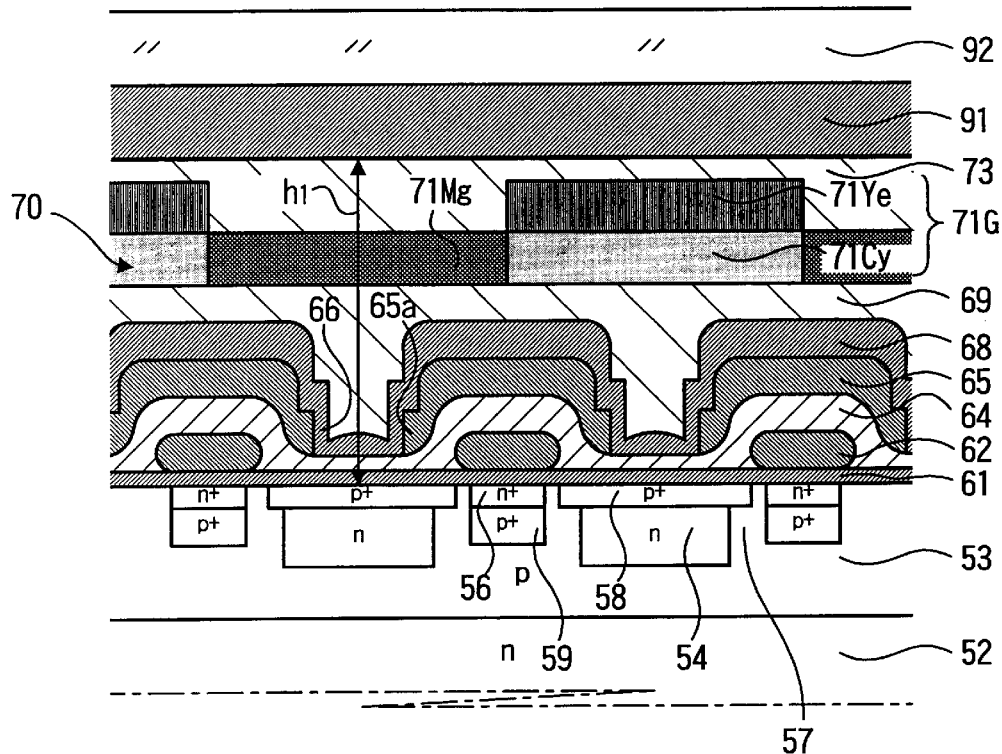
FIGS. 23A and 23B are manufacturing process diagrams of the solid state imaging device of FIG. 21 (showing sectional views of FIG. 24 in the horizontal direction and the vertical direction, respectively)
Figure 23B:
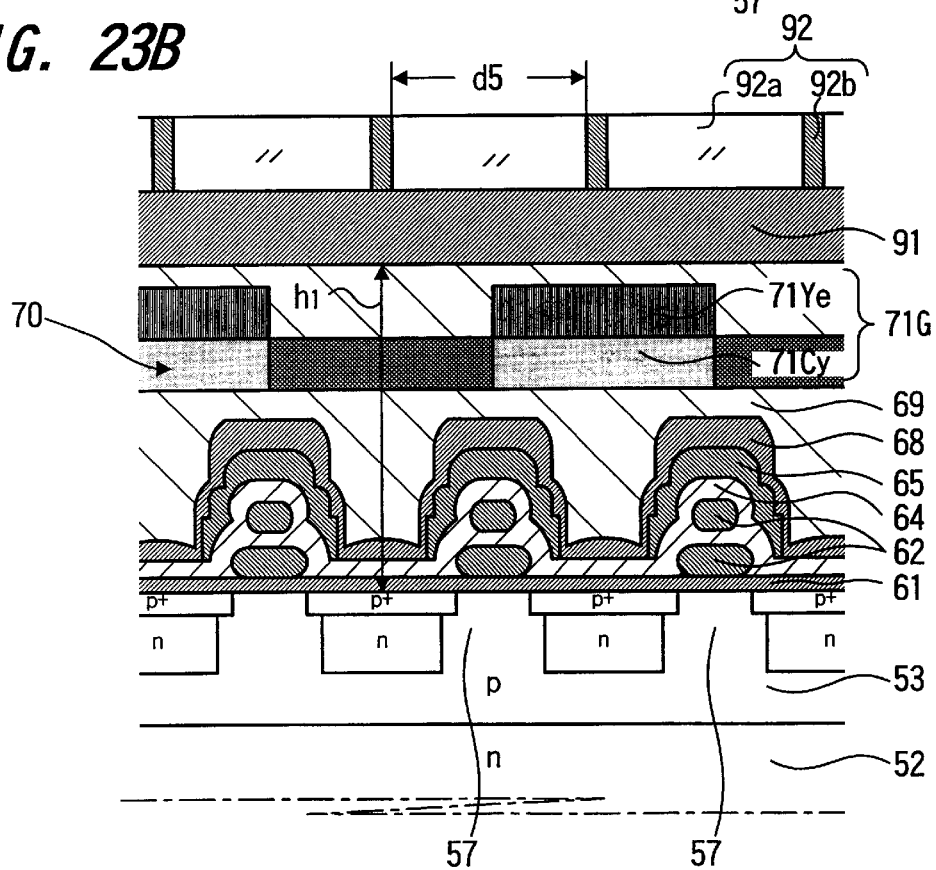
Figure 29A:
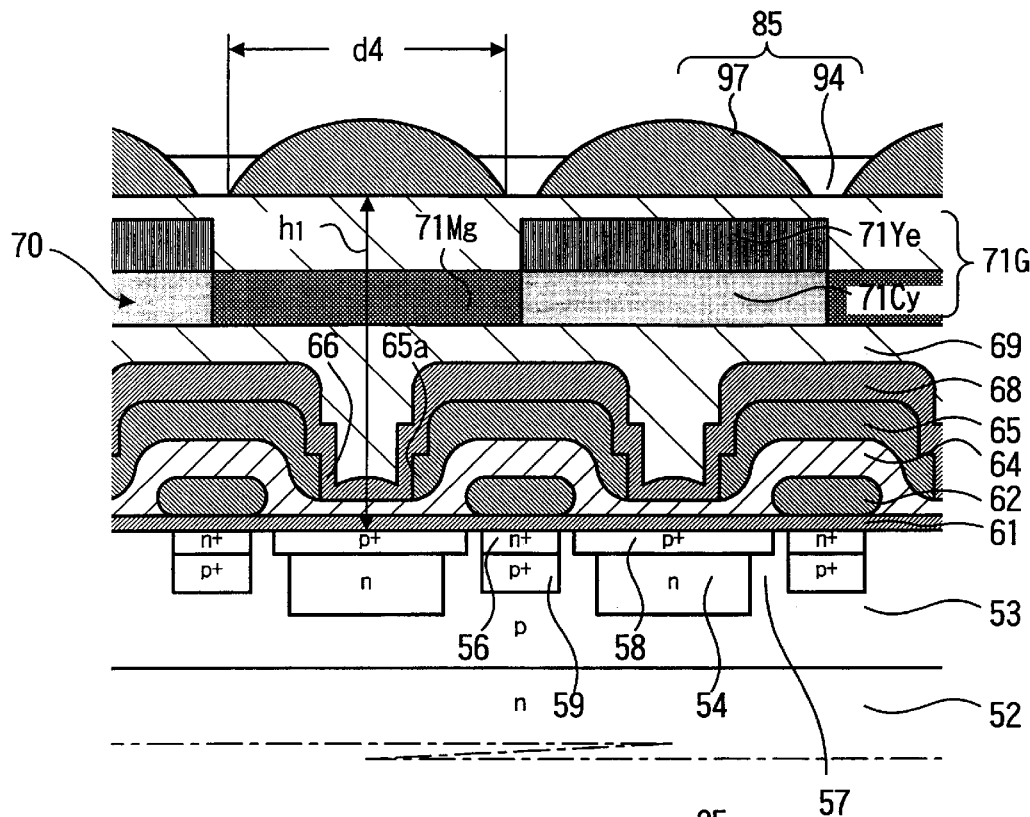
FIGS. 29A and 29B are manufacturing process diagrams of the solid state imaging device of FIG. 21 (showing sectional views of FIG. 30 in the horizontal direction and the vertical direction, respectively)
Figure 29B:
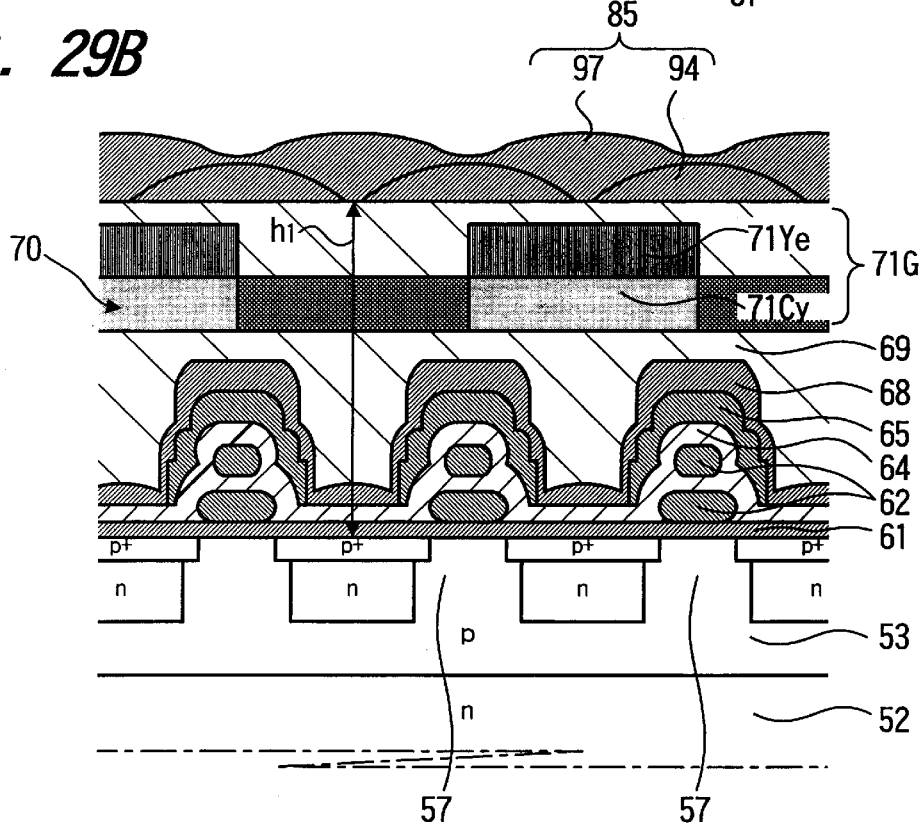
Figure 30:
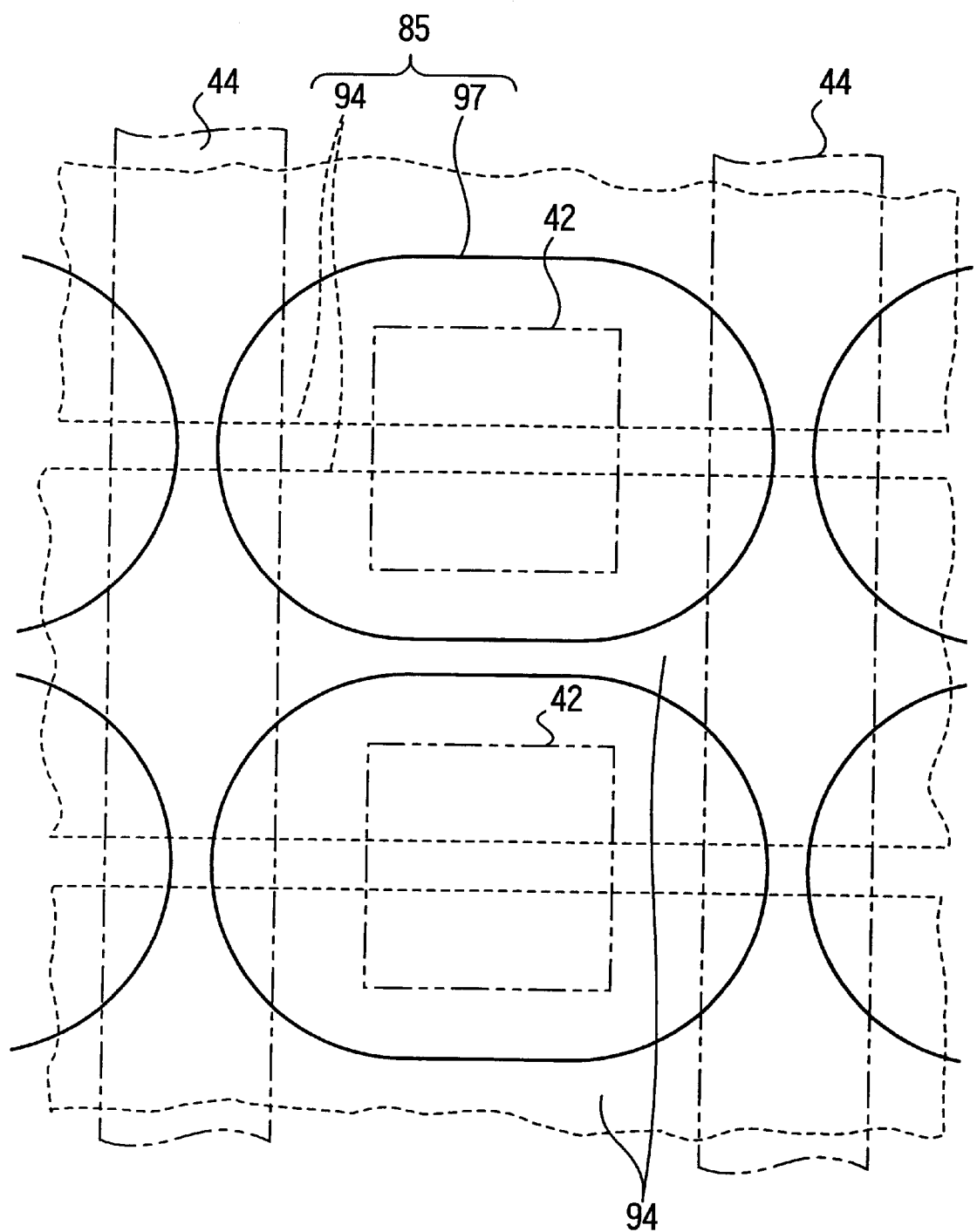
FIG. 30 is a plan view of FIGS. 29A and 29B.

FIGS. 23A, 23B and 30 show an example of a method for manufacturing the above described CCD solid state imaging device 83, especially its on-chip micro-lens 85. FIGS. 23A and 23B, FIGS. 25A and 25B, FIGS. 27A and 27B, and FIGS. 29A and 29B show sections in the horizontal direction and in the vertical direction for corresponding plan views of FIGS. 24, 26, 28 and 30, respectively.

Figure 24:
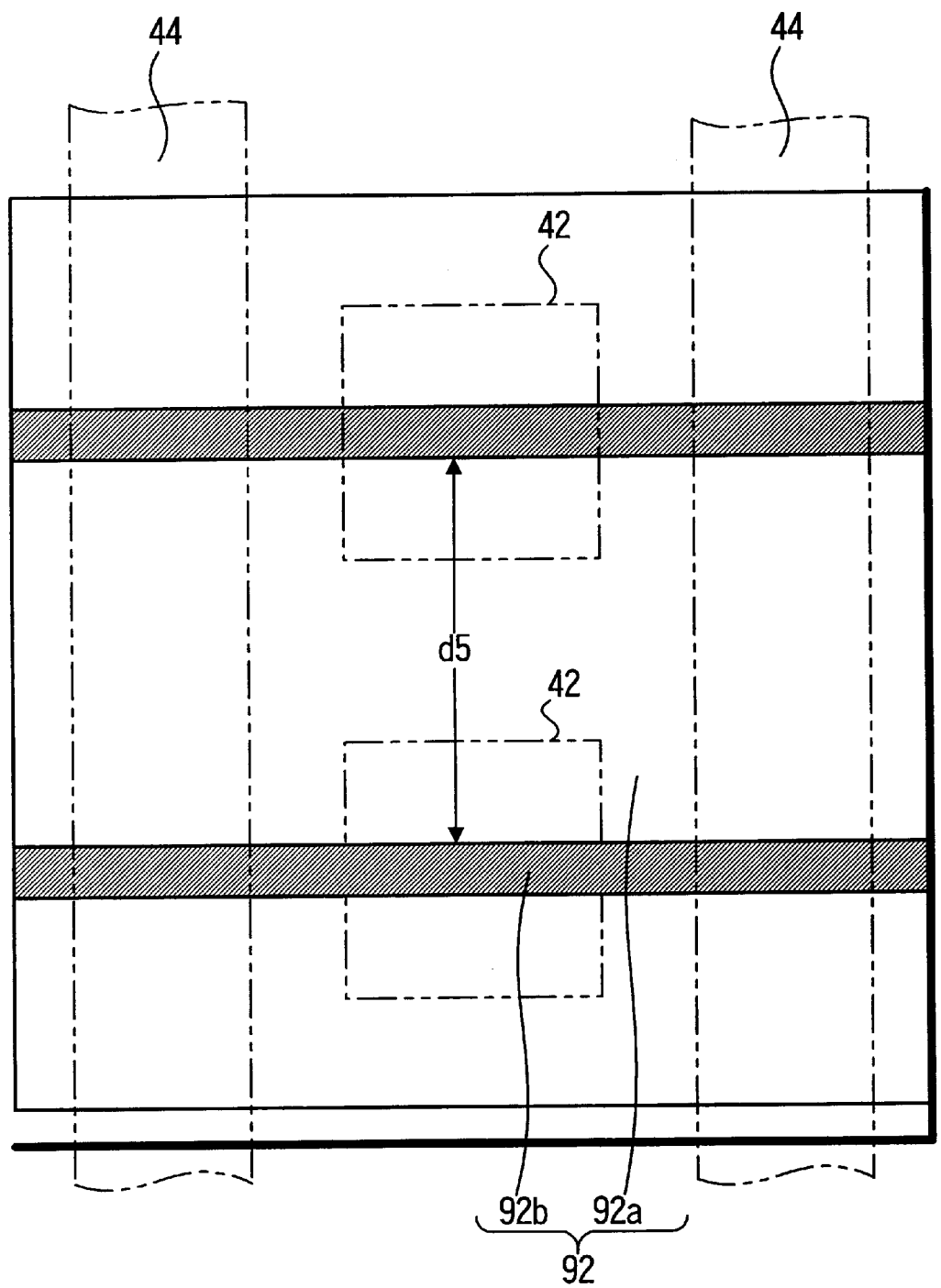
FIG. 24 is a plan view of FIGS. 23A and 23B.

First of all, the light receiving section 42, the vertical transfer register 44, the light shield film 65, and the color filter layer 70 are formed as shown in FIGS. 23A, 23B and 24. Thereafter, on the entire surface of the color filter layer 70, a first photoresist 91 of, for example, a negative type serving as a lens material is coated and formed via a planarization film 73. On the first photoresist layer 91, a first mask 92 is formed. The first mask 92 includes light transmitting sections 92a extending in the horizontal direction in a stripe form, and light shield sections 92b of a stripe form located between the stripe-shaped light transmitting sections 92a.

As for the light transmitting section 92a of the first mask 92, the center of the pattern of light transmitting section 92a in the vertical direction is located not over the light receiving section 42, but above the pixel separation section 57 between the light receiving sections 42. The light transmitting section 92a becomes a stripe-shaped pattern having such a width in the vertical direction that the pattern extends over parts of light receiving sections adjacent with each other in the vertical direction.

In FIG. 24, the light transmitting section 92a of the mask 92 is illustrated as a stripe-shaped pattern in the horizontal direction. However, such a pattern which continues in the horizontal direction, but its width changes, namely may have unevenness in view plane may be used. For example, the stripe-shaped pattern may have a narrow width in a portion corresponding to the light receiving section 42 as compared with the width corresponding to the pixel separation section 57 in the horizontal direction.

Light is irradiated via the first mask 92 on the first photoresist layer 91 to expose the same to light.

Figure 25A:
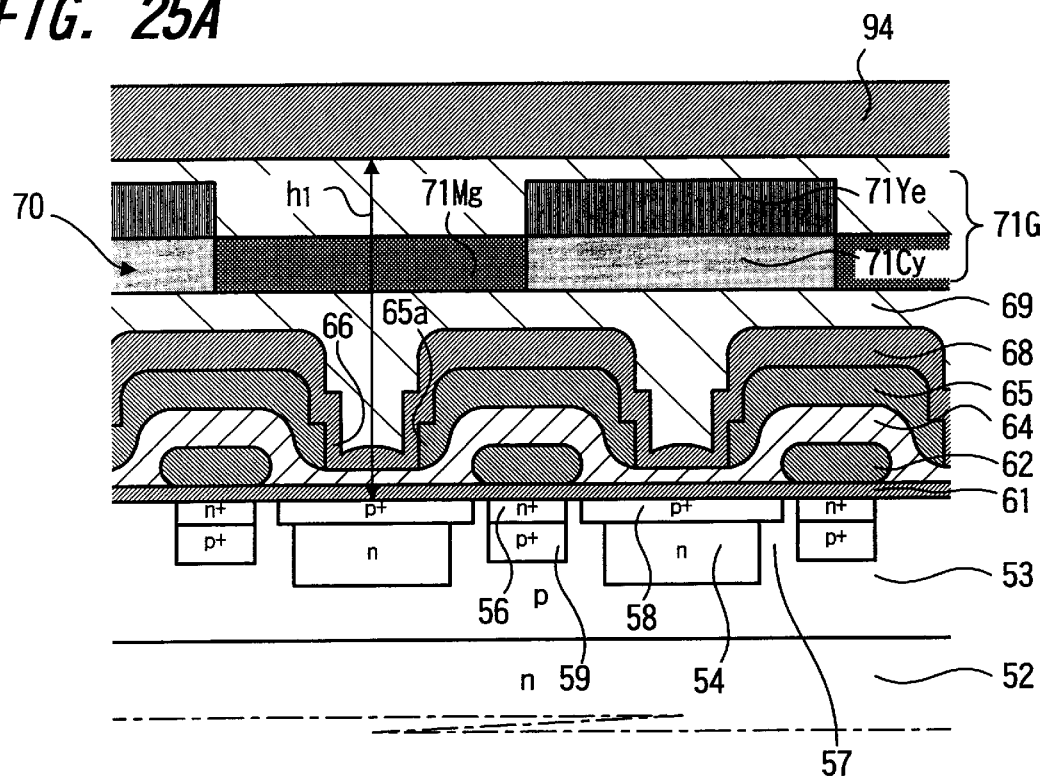
FIGS. 25A and 25B are manufacturing process diagrams of the solid state imaging device of FIG. 21 (showing sectional views of FIG. 26 in the horizontal direction and the vertical direction, respectively)
Figure 25B:
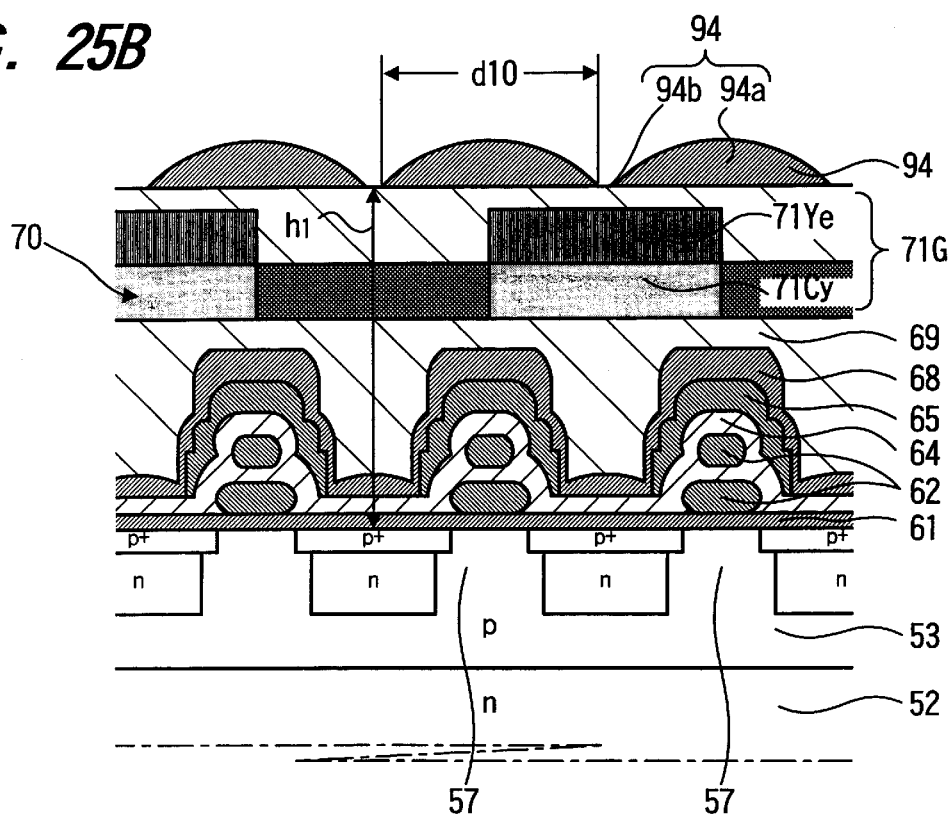
Figure 26:
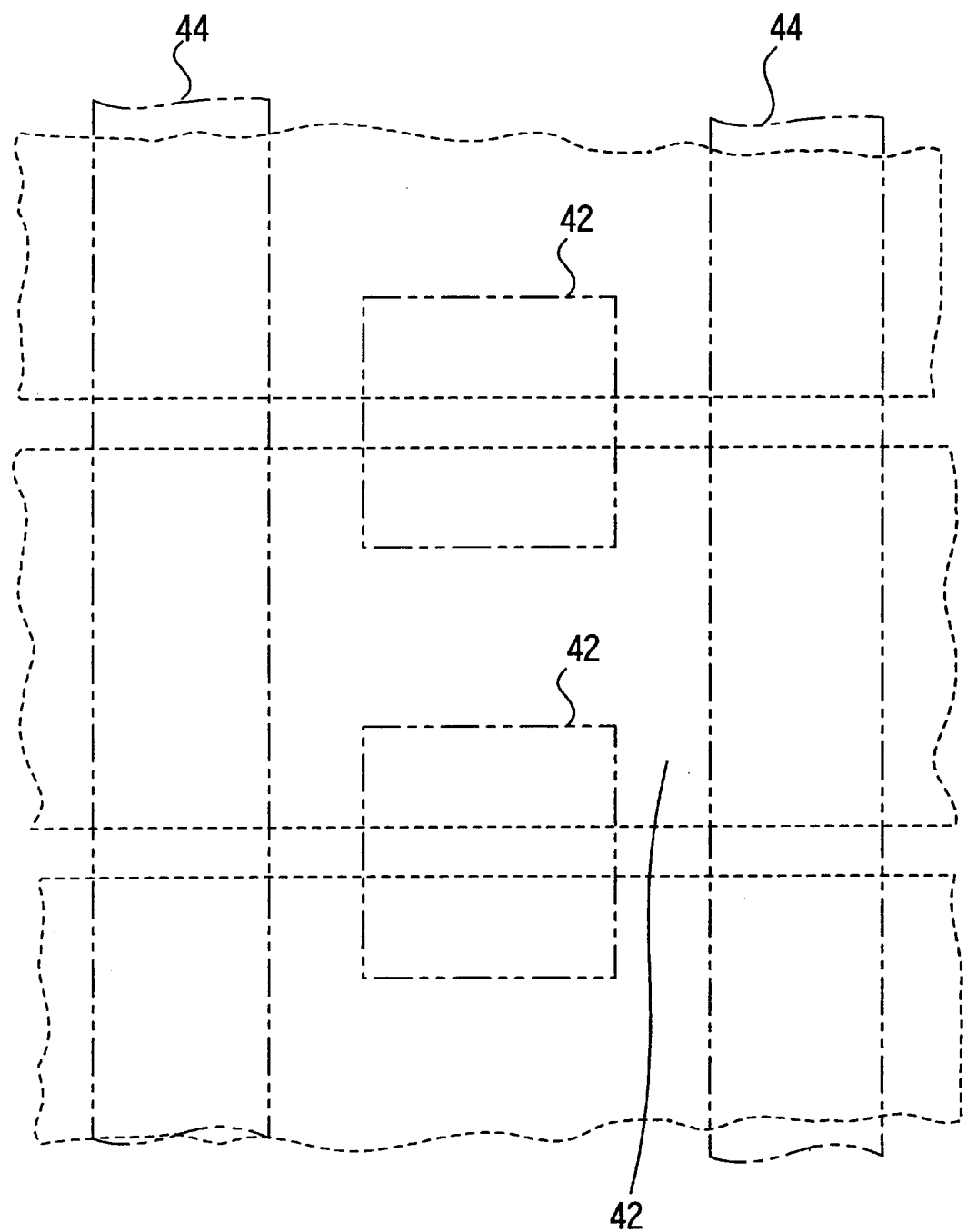
FIG. 26 is a plan view of FIGS. 25A and 25B.

Subsequently, as shown in FIGS. 25A, 25B and 26, development is conducted so as to remove areas of the first photoresist layer 91 which have not yet been exposed to light. Thereafter, heat treatment is conducted thereon and reflow is effected by utilizing the viscosity of the photoresist layer 91 to form a dome-shaped lens layer 94 of the first layer serving as the foundation layer taking the shape of a stripe in the horizontal direction.

At this time, the thickness of the lens layer 94 of the first layer is thin. Thereafter, heat treatment at approximately 100 to 150° C. for 30 to 300 seconds, for example, is conducted in the atmosphere under the normal pressure to fix the shape.

When the lens layer 94 of the first layer is seen as a whole, a plurality of lens layers 94 are formed in parallel, and each lens layer 94 takes such semicylindrical shapes as to have a convex portion 94a in the pixel separation section 57 between the light receiving sections 42 in the vertical direction. On the line connecting the centers of the light receiving sections 42 in the horizontal direction, therefore, a valley between the lens layers 94, i.e., a concave portion 94b is formed.

Figure 27A:
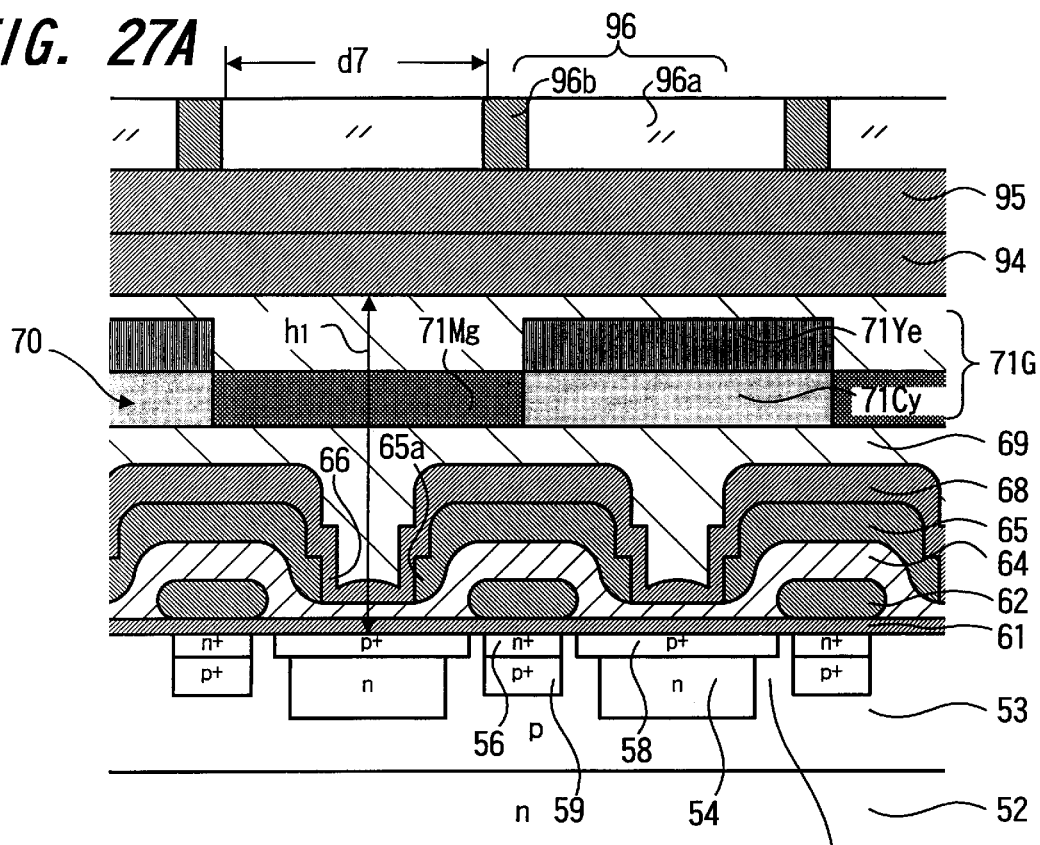
FIGS. 27A and 27B are manufacturing process diagrams of the solid state imaging device of FIG. 21 (showing sectional views of FIG. 28 in the horizontal direction and the vertical direction, respectively)
Figure 27B:
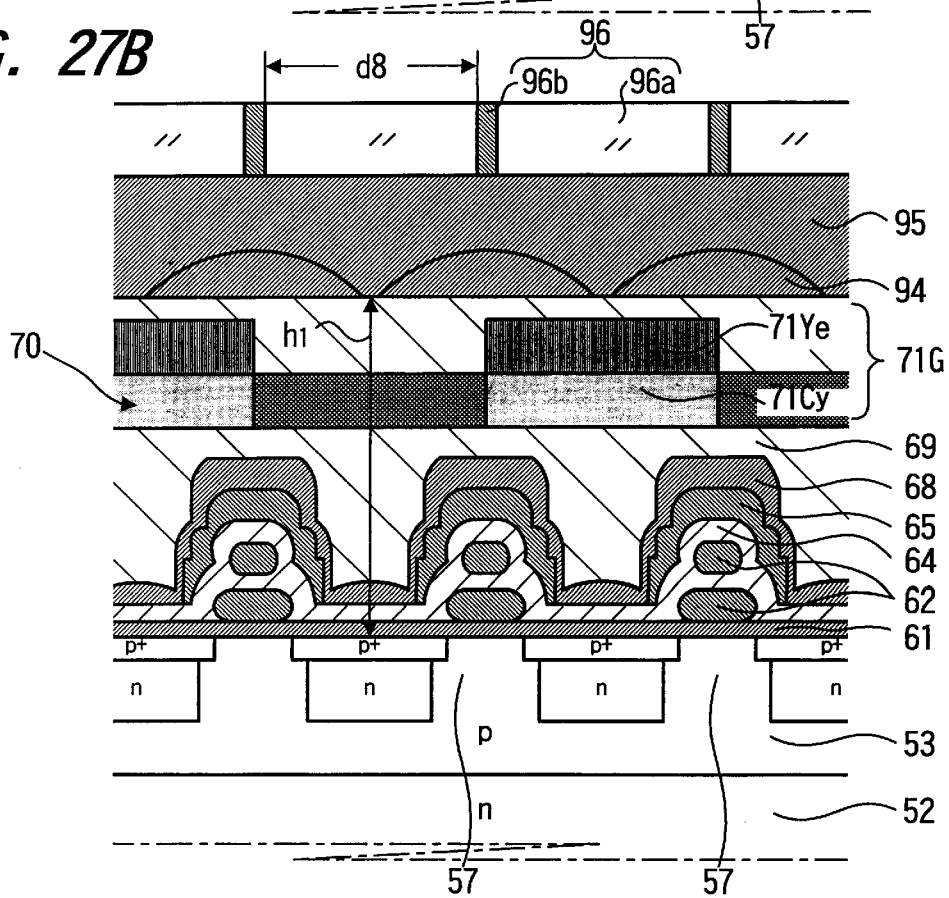
Figure 28:
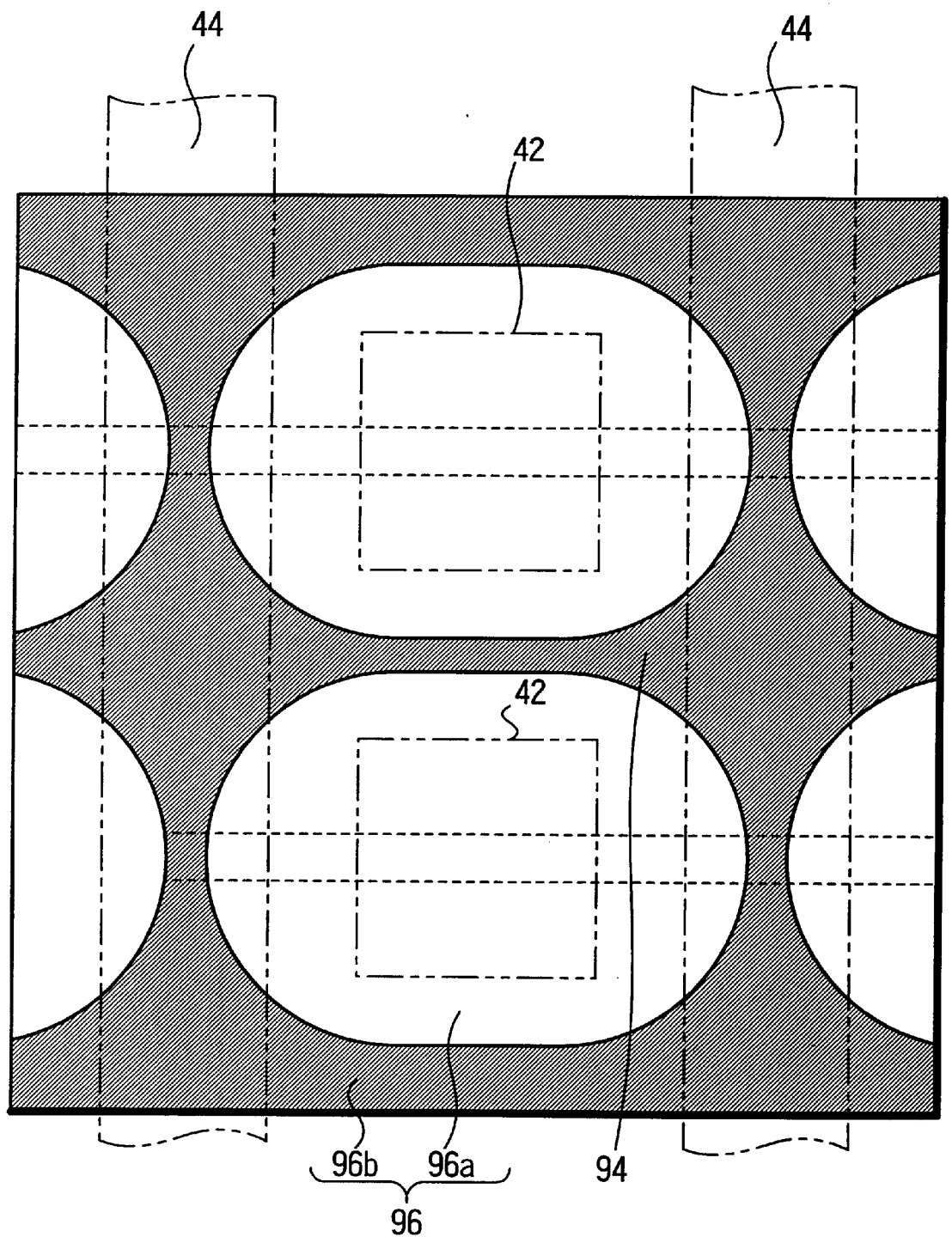
FIG. 28 is a plan view of FIGS. 27A and 27B.

Subsequently, over the entire surface including the lens layer 94 of the first layer, a second photoresist layer 95 of, for example, the same negative type serving as a lens material is formed so as to fill up the concave portions 94b of the first lens layer 94 as shown in FIGS. 27A, 27B and 28. On the second photoresist layer 95, there is formed a second mask 96 including light transmitting sections 96a separated into shapes which are long in the lateral direction and light shield sections 96b located between the adjacent light transmitting sections 96a so as to correspond to each pixel.

As for the light transmitting sections 96a of the second mask 96, the center of the pattern of each light transmitting section 96 in the vertical direction corresponds to the center of the light receiving section 42 in the same way as the foregoing description. As a whole, the light transmitting sections 96a are formed at the positions corresponding to respective pixels around the light receiving sections 42. In the illustrated example, the light transmitting section 96a takes a shape which is long in the lateral direction and which has a circular arc at both ends in the horizontal direction.

Light is irradiated via the second mask 96 on the second photoresist layer 95 to expose the same to light.

Subsequently, as shown in FIGS. 29A, 29B and 30, development is conducted so as to remove areas of the second photoresist layer which have not yet been exposed to light. Thereafter, reflow is effected thereon by heat treatment to form the lens layer 97 of the second layer. The lens layer 97 of the second layer fills up the lower portion of the lens layer 94 of the first layer, i.e., the concave portion 94b. By high viscosity of the lens material, the planarization property is low. As a result of such delicate balance, a nonspherical lens layer as shown in FIGS. 29A and 29B is obtained.

By the lens layer 94 of the first layer serving as the foundation layer and the lens layer 97 of the second layer serving as a substantial lens, the target on-chip micro-lens 85 is formed and the desired CCD solid state imaging device 83 with the on-chip micro-lens 8 is obtained.

In the third embodiment, the lens layer 94 of the first layer is formed so as to have a pattern center in the vertical direction located in the so-called pixel separation section 57 between the light receiving sections 42. A plurality of such stripe shaped lens layers 94 extend in the horizontal direction. The lens layer 97 of the second layer is formed so as to fill up the concave portion 94b between the lens layers 94 of the first layer, partially overlap on the convex portion 94a of the lens layers 94 of the first layer, and correspond to the light receiving sections 42 of respective pixels. By the lens layer 94 of the first layer and lens layer 97 of the second layer, the on-chip micro-lens 85 is formed. As a result, the lens layer 97 of the second layer serving as a substantial lens becomes a nonspherical lens. In the case where the size of the unit pixel in the horizontal direction is different from that in the vertical direction, i.e., in the case of a unit pixel having an aspect ratio other than 1, the focusing efficiency of the incident light L can be made optimum in both the horizontal and vertical directions as shown in FIGS. 22A and 22B.

As a result, the imaging characteristics concerning the sensitivity, smear and so on in the CCD solid state imaging device can be improved.

In addition, the uniformity of the output between a small light quantity and a large light quantity is improved irrespective of the sensitivity and light quantity.

In this on-chip micro-lens 85, the lens layer 94 of the first layer is formed as a stripe-shaped pattern continuing in the horizontal direction. Therefore, it is not necessary to pay attention to misalignment of patterns in the horizontal direction, thus manufacturing being facilitated.

In the present invention, it does not matter what material is used for the on-chip color filter layer, the on-chip micro-lens or the like.

While in the above described example the photoresist of the negative type has been used as the material of the on-chip micro-lens, a photoresist of a positive type may also be used.

Further, while in the above described example the photoresist layer is patterned and the lens shape is completed by using the reflow method, a method of transcribing the lens shape from the reflow shape to the lens material layer of the lower part by means of the whole surface etching may also be used.

Figure 31A:
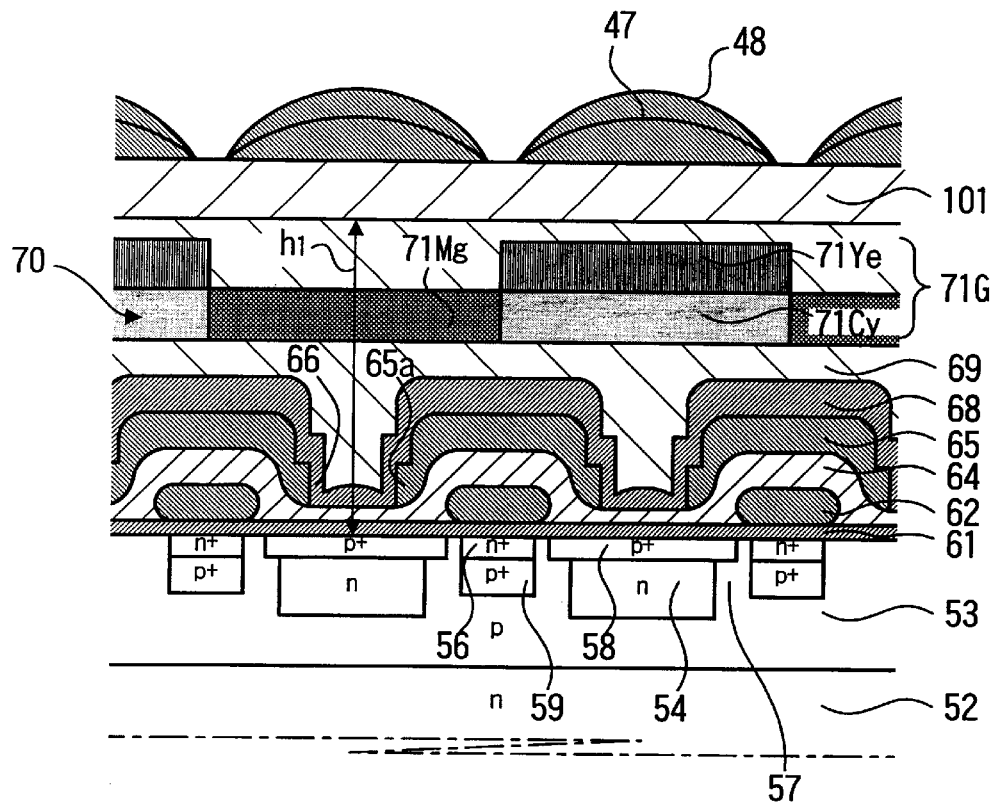
FIGS. 31A and 31B are manufacturing process diagrams of a fourth embodiment of the solid state imaging device according to the present invention (showing sectional views in the horizontal direction and the vertical direction, respectively)
Figure 31B:
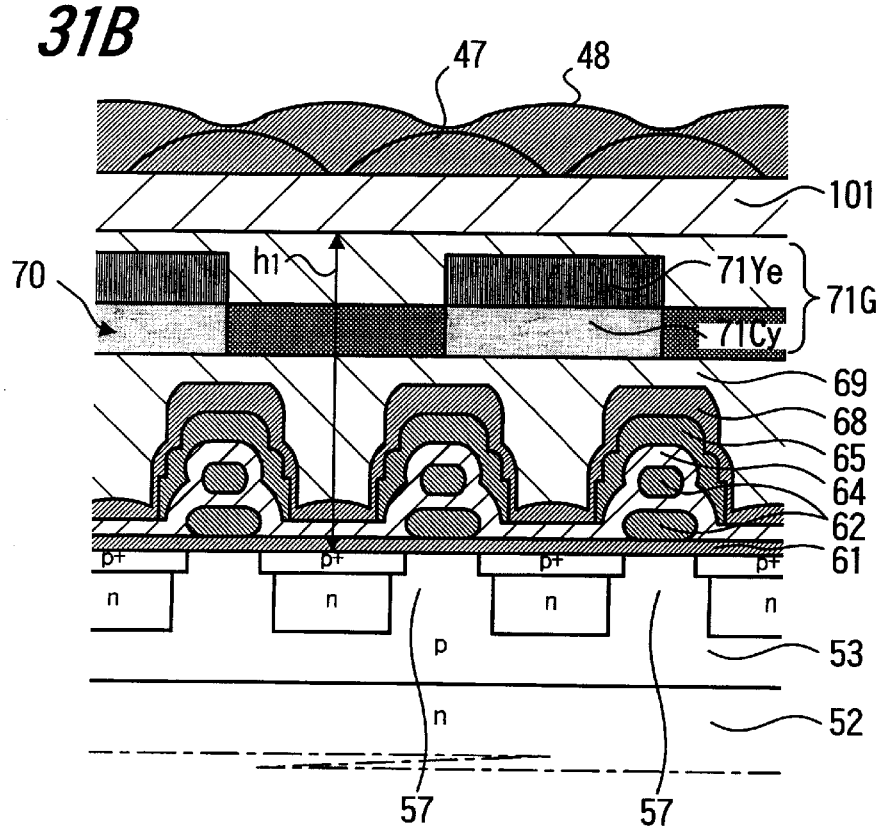
Figure 32A:
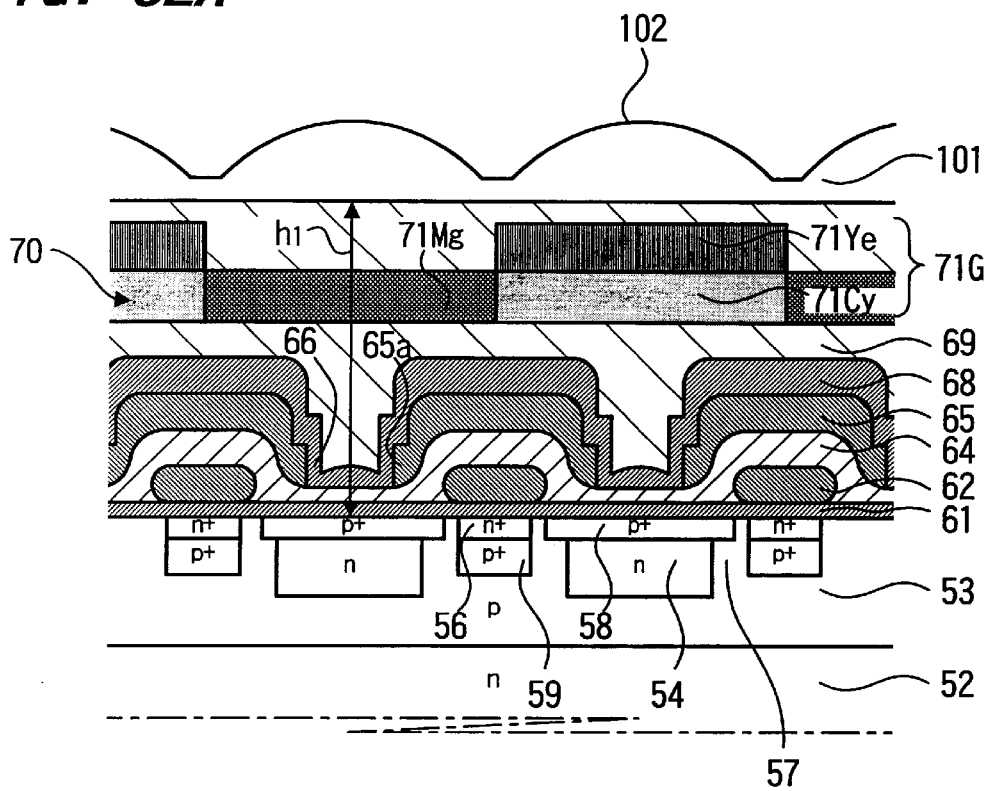
FIGS. 32A and 32B are manufacturing process diagrams of the fourth embodiment of the solid state imaging device according to the present invention (showing sectional views in the horizontal direction and the vertical direction, respectively).
Figure 32B:
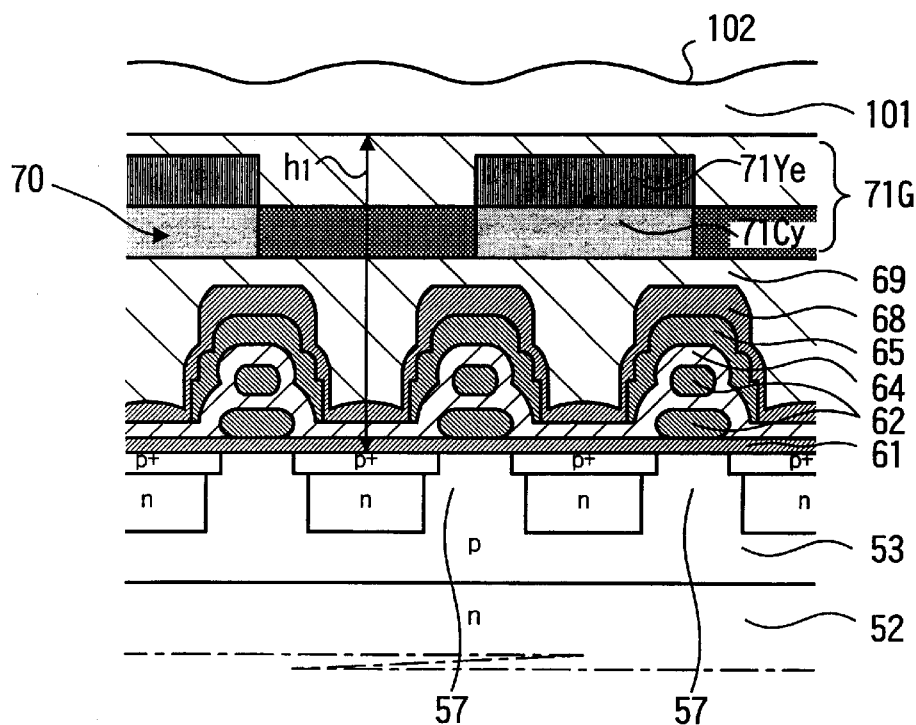

In other words, a lens material layer 101 is formed on the color filter layer 70 via the planarization film 73, for example, as shown in FIGS. 31A and 31B. On the lens material layer 101, the foundation layer (lens layer of the first layer) 47 using the photoresist layer and the upper layer 48 having a lens face (lens layer of the second layer) shown in FIGS. 15A and 15B are formed. Thereafter, the whole face etch back is conducted. As shown in FIGS. 32A and 32B, the lens face of the upper layer 48 is transcribed to the lens material layer 101. Thus, a target on-chip micro-lens 102 can be formed.

If in the solid state imaging device according to the present invention the light receiving sections are arranged with different pitches in the horizontal and vertical directions, an on-chip micro-lens having an optimized focusing efficiency in both the horizontal direction and the vertical direction can be formed. As a result, the imaging characteristics concerning the sensitivity, smear and so on can be improved. In addition, the uniformity of the output between a small light quantity and a large light quantity is improved irrespective of the sensitivity and light quantity.

When forming the foundation layer constituting the on-chip micro-lens in a stripe form continuing in the coarse pitch direction, it is not necessary to pay attention to misalignment in the coarse pitch direction, thus manufacturing of the target on-chip micro-lens being facilitated. When the foundation layer constituting the on-chip microlens is formed in divisions corresponding to respective light receiving sections and the width at both ends in the coarse pitch direction is set different from the width in the center, the focusing efficiency not only in the horizontal and vertical directions but also in the diagonal direction can be optimized.

In a method for manufacturing the solid state imaging device according to the present invention, its on-chip microlens is manufactured by forming a dome-shaped foundation layer so as to correspond to gaps between the light receiving sections in the fine pitch direction, and forming lenses on the concave portions so as to fill up the concave portions of the foundation layer, partially overlap on the convex portions, and correspond to the light receiving sections. As a result, an on-chip micro-lens having a focusing efficiency optimized in both the horizontal and vertical directions is obtained.

In a method for manufacturing the solid state imaging device according to the present invention, the foundation layer and the upper layer (lens) as described above are formed on the lens material layer, and etch back is conducted to transcribe the lens face of the upper layer to the lens material layer. As a result, an on-chip micro-lens having a focusing efficiency optimized in both the horizontal and vertical directions is obtained.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising:
    a plurality of light receiving sections arranged in horizontal and vertical directions with different pitches;
    a foundation layer formed over said light receiving sections, said foundation layer having convex portions between the light receiving sections in a fine pitch direction and concave portions at least along a straight line connecting centers of said light receiving sections in a coarse pitch direction; and
    a plurality of lenses formed on said concave portions so as to at least partially overlap on said convex portions in correspondence with said light receiving sections.

2. A solid state imaging device according to claim 1, wherein said foundation layer is formed in a stripe form continuing in said coarse pitch direction.

3. A solid state imaging device according to claim 1, wherein said foundation layer is formed in divisions in correspondence with said respective light receiving sections in said coarse pitch direction.

4. A solid state imaging device according to claim 1,
    wherein said foundation layer is formed in divisions in correspondence with said respective light receiving sections in said coarse pitch direction, and a width of said foundation layer at both ends in said coarse pitch direction is set different from a width at its central part.

5. A method for manufacturing a solid state imaging device by forming lenses over a plurality of light receiving sections arranged in horizontal and vertical directions with different pitches; said method comprising:

a first process for forming a foundation layer over said light receiving sections, said foundation layer having convex portions on portions between said light receiving sections in a fine pitch direction and concave portions at least along a straight line connecting centers of said light receiving sections in a coarse pitch direction; and a second process for forming lenses on said concave portions so as to at least partially overlap on said convex portions in correspondence with said light receiving sections.

6. A method for manufacturing a solid state imaging device according to claim 5, wherein said first process comprises the steps of:

forming a film on an entire face over the light receiving sections; and partially removing said film at least along a straight line connecting centers of said light receiving sections in a coarse pitch direction.

7. A method for manufacturing a solid state imaging device according to claim 6, wherein said first process comprises a process for reflowing said film, after said partially film removing process.

* * * * *